United States Patent
Yahagi

(10) Patent No.: US 9,461,257 B2
(45) Date of Patent: Oct. 4, 2016

(54) ELECTRONIC DEVICE INSULATING LAYER, AND METHOD FOR PRODUCING ELECTRONIC DEVICE INSULATING LAYER

(71) Applicant: SUMITOMO CHEMICAL COMPANY, LIMITED, Chuo-ku, Tokyo (JP)

(72) Inventor: Isao Yahagi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 222 days.

(21) Appl. No.: 14/380,400

(22) PCT Filed: Feb. 26, 2013

(86) PCT No.: PCT/JP2013/054983
§ 371 (c)(1),
(2) Date: Aug. 22, 2014

(87) PCT Pub. No.: WO2013/129406
PCT Pub. Date: Sep. 6, 2013

(65) Prior Publication Data
US 2015/0008418 A1      Jan. 8, 2015

(30) Foreign Application Priority Data

Mar. 1, 2012   (JP) ................................. 2012-045695

(51) Int. Cl.
| | |
|---|---|
| *H01L 51/05* | (2006.01) |
| *H01L 51/10* | (2006.01) |
| *H01L 51/00* | (2006.01) |

(52) U.S. Cl.
CPC ....... *H01L 51/0529* (2013.01); *H01L 51/0541* (2013.01); *H01L 51/0545* (2013.01);
(Continued)

(58) Field of Classification Search
None
See application file for complete search history.

(56) References Cited

U.S. PATENT DOCUMENTS

| | | |
|---|---|---|
| 6,511,756 B1 | 1/2003 | Obuchi et al. |
| 2010/0237326 A1 | 9/2010 | Ohta |

(Continued)

FOREIGN PATENT DOCUMENTS

| | | |
|---|---|---|
| CN | 101784958 A | 7/2010 |
| CN | 102138218 A | 7/2011 |

(Continued)

OTHER PUBLICATIONS

D.K. Hwang, et al., "Comparative studies on the stability of polymer versus $SiO_2$ gate dielectrics for pentacene thin-film transistors", Applied Physics Letters, vol. 89, 2006, pp. 093507-1-093507-3.

(Continued)

*Primary Examiner* — Robert S Loewe
(74) *Attorney, Agent, or Firm* — Sughrue Mion, PLLC

(57) ABSTRACT

An object of the present invention is to provide an electronic device insulating layer which may improve characteristics of an electronic device. The means for solving the object is an electronic device insulating layer comprising a first insulating layer formed from a first insulating layer material and a second insulating layer formed on the first insulating layer from a second insulating layer material, the first insulating layer material being an insulating layer material comprising a photosensitive resin material (A), a tungsten (V) alkoxide (B) and a basic compound (C), the second insulating layer material being an insulating layer material comprising a polymer compound (D) which contains a repeating unit containing a cyclic ether structure and a repeating unit having an organic group capable of producing a phenolic hydroxyl group by the action of an acid.

22 Claims, 1 Drawing Sheet

(52) U.S. Cl.
CPC ......... *H01L51/107* (2013.01); *H01L 51/0023* (2013.01); *H01L 51/055* (2013.01); *Y10T 428/31909* (2015.04)

(56) References Cited

U.S. PATENT DOCUMENTS

| | | | |
|---|---|---|---|
| 2011/0136992 A1* | 6/2011 | Yahagi | C08G 18/61 525/474 |
| 2011/0193071 A1 | 8/2011 | Yahagi | |
| 2012/0235148 A1 | 9/2012 | Yahagi | |
| 2012/0292626 A1* | 11/2012 | Yahagi | C09J 133/02 257/59 |
| 2014/0070205 A1* | 3/2014 | Yahagi | C08F 12/22 257/40 |

FOREIGN PATENT DOCUMENTS

| | | |
|---|---|---|
| JP | 04-132729 A | 5/1992 |
| JP | 11-124429 A | 5/1999 |
| JP | 2003-158134 A | 5/2003 |
| JP | 2007-19121 A | 1/2007 |
| JP | 2007-305950 A | 11/2007 |
| JP | 2011-86926 A | 4/2011 |
| WO | 2007/099689 A1 | 9/2007 |

OTHER PUBLICATIONS

Se Hyun Kim, et al., "Hysteresis-free pentacene field-effect transistors and inverters containing poly(4-vinyl phenol-co-methyl methacrylate) gate dielectrics", Applied Physics Letters, vol. 92, 2008, pp. 183306-1-182206-3.

International Search Report mailed May 21, 2013 in International Application No. PCT/JP2013/054983.

International Preliminary Report on Patentability and Written Opinion issued Sep. 2, 2014 in International Application No. PCT/JP2013/054983.

Machine generated translation of CN 101784958.

Communication dated Jan. 13, 2016, from the State Intellectual Property Office of People's Republic of China in counterpart Application No. 201380011819.1.

* cited by examiner

ELECTRONIC DEVICE INSULATING LAYER, AND METHOD FOR PRODUCING ELECTRONIC DEVICE INSULATING LAYER

CROSS REFERENCE TO RELATED APPLICATIONS

This application is a National Stage of International Application No. PCT//JP2013/054983, filed Feb. 26, 2013, claiming priority from Japanese Patent Application No. 2012-045695, filed Mar. 1, 2012, the contents of all of which are incorporated herein by reference in their entirety.

TECHNICAL FIELD

The present invention relates to an electronic device insulating layer which is an insulating layer included in an electronic device, in particular, an electronic device insulating layer having a two-layer structure.

BACKGROUND ART

In recent years, research of electronic devices such as organic thin film transistors and the like receive attention, and various materials to be used for the electronic devices are investigated. Among these, development of materials for forming an insulating layer included in the electronic device is actively carried out in order to suppress deterioration of the electronic device over time.

The "electronic device" means an active device which uses actions of electrons. The "electronic device insulating layer" means an insulating layer included in an electronic device, and examples thereof include an organic thin film transistor insulating layer, an organic electroluminescence device insulating layer, an electronic paper insulating layer, an RFID tag insulating layer, and a liquid crystal display insulating layer. An electronic device insulating layer material means a material used for forming the above-mentioned electronic device insulating layer. Hereinafter, the present invention will be explained by using organic thin film transistors as a representative example of the electronic device.

Since an organic thin film transistor which is one aspect of the electronic device can be produced at lower temperatures than inorganic semiconductors, a plastic substrate or film can be used as a substrate of the organic thin film transistor, and by using such a substrate, a device which is flexible, and is lightweight and is hardly breakable can be obtained. Moreover, since there are cases where a device can be produced by film formation using a method of applying or printing a solution containing an organic material, there are also cases where a large number of devices can be produced on a substrate of large area at low cost.

Furthermore, since there are a wide variety of materials which can be used for the investigation of organic thin film transistors, a device with a wide range of varied characteristics can be produced by using materials varying in molecular structure in the investigation.

In electric field effect type organic thin film transistors, which are one type of organic thin film transistors, the voltage applied to a gate electrode acts on an organic semiconductor layer through a gate insulating layer, and thereby the current amount of a drain current is controlled. In addition, a gate insulating layer formed between a gate electrode and an organic semiconductor layer prevents a drain current from flowing to the gate electrode.

Moreover, organic semiconductor compounds to be used for the formation of organic semiconductor layers of electric field effect type organic thin film transistors are susceptible to environmental influences such as humidity, oxygen and the like, and therefore transistor characteristics are likely to be deteriorated over time due to humidity, oxygen and the like.

Therefore, in the device architecture of a bottom-gate type organic thin film transistor, which is one kind of electric field effect type organic thin film transistors, with an organic semiconductor compound exposed thereon, it is necessary to form an overcoat insulating layer covering the whole structure of the device so as to protect the organic semiconductor compound from being in contact with the open air. On the other hand, in the device architecture of a top gate type organic electric field effect transistor, which is another kind of electric field effect type organic thin film transistors, an organic semiconductor compound is coated and protected with a gate insulating layer. Thus, insulating layer materials are used in order to form a gate insulating layer and an overcoat insulating layer covering organic thin film transistors, both of which cover the organic semiconductor layer.

In the specification, an insulating layer or an insulating film of an electronic device such as the above-mentioned gate insulating layer and the overcoat insulating layer is referred to as an electronic device insulating layer. A material used for the formation of an electronic device insulating layer is referred to as an electronic device insulating layer material. Also, a material used to form the organic thin film transistor insulating layer is referred to as an organic thin film transistor insulating layer material.

The organic thin film transistor insulating layer material is required to have electrical insulating properties and characteristics superior in electrical breakdown strength when having been formed into a thin film. Further, particularly in the bottom-gate type electric field effect type organic thin film transistor, an organic semiconductor layer is formed on the gate insulating layer. Therefore, the organic thin film transistor gate insulating layer material is required to have affinity with an organic semiconductor compound for forming an interface in close contact with the organic semiconductor layer and to have flatness of the surface on the organic semiconductor layer side of the film formed from the organic thin film transistor gate insulating layer material.

As a technology responding to such requirements, Patent Document 1 describes an organic thin film transistor insulating layer material in which an epoxy resin is used in combination with a silane coupling agent and an organic thin film transistor formed by using the organic thin film transistor gate insulating layer material. In this technology, a hydroxyl group produced at the time of a curing reaction of the epoxy resin is reacted with the silane coupling agent. The reason for this is that the above-mentioned hydroxyl group enhances the hygroscopic properties of the organic thin film transistor insulating layer material and impairs the stability of transistor performance.

Non-Patent Document 1 describes the use of a resin prepared by thermally cross-linking polyvinylphenol and a melamine compound at 175° C. for a gate insulating layer. In this technology, by cross-linking with the melamine compound, the hydroxyl groups contained in the polyvinylphenol are removed and the film strength is increased simultaneously. A pentacene TFT having this gate insulating layer has low hysteresis and exhibits durability to a gate bias stress.

Non-Patent Document 2 describes that polyvinylphenol and a copolymer prepared by copolymerizing vinylphenol with methyl methacrylate are heated at 150° C. and used for a gate insulating layer. In this technology, the polarity of the whole film is reduced by interactions between the hydroxyl group of vinylphenol and the carbonyl group of methyl methacrylate. A pentacene TFT having this gate insulating layer has low hysteresis and exhibits stable electric properties.

However, in consideration of practical use such as driving a light emitting device such as an organic electroluminescence device (organic EL device), the operating accuracy of an organic thin film transistor has to be further improved and the fall effect of a hysteresis is still insufficient in the above-mentioned conventional gate insulating layer.

In addition, in consideration of practical use of an organic thin film transistor, it is necessary to form a penetrating part such as a via hole in an insulating layer formed between an upper electrode and a lower gate electrode and to join the upper electrode and the lower gate electrode.

However, since the above-mentioned conventional material does not have photosensitivity, it is difficult to be patterned at the time of formation of an insulating layer. Therefore, to form a penetrating part such as a via hole in an insulating layer, it requires the steps of: firstly applying a solution containing a resist material on an insulating layer and forming a resist layer; exposing the resist layer through a mask; developing the resist layer and to form a pattern of the resist layer; transferring the pattern to the insulating layer by using the resist layer as a mask in which the pattern was formed; and carrying out the exfoliation and the removal of the resist layer in which the pattern was formed. Thus, the production process becomes complicated.

A metal is usually used for an electrode of an organic thin film transistor, and a metal electrode is formed above an organic layer. A metal electrode is usually formed by forming a metal layer on the whole surface of an organic layer by the sputtering process and by the subsequent patterning. By passing through this process, a member which has many devices on a substrate of a large area can be simply produced.

However, since a metal steam used for the sputtering process has high energy, characteristics of an organic compound in an organic layer may vary when the organic layer contacts the metal steam.

Particularly, in a step of etching and a step of the liftoff at the time of patterning a metal layer, an etching solution containing a relatively strong alkali or acid is used. Such a relatively strong alkali or acid contained in an etching solution may change characteristics of an organic compound in an organic layer of a base.

If characteristics of an organic compound in an organic layer vary by a metal steam, strong acid, or strong alkali, the surface of the organic layer exposed by the patterning at the time of the formation of an electrode changes in characteristics as compared with the condition before the formation of an electrode and the performance of an organic thin film transistor is adversely affected. For example, if an organic insulating material is used as a gate insulating layer of an organic thin film transistor and then a metal is vapor-deposited directly on an insulating layer by the sputtering process to form a metal layer, and the metal layer is patterned to form a sauce electrode and a drain electrode, the hydrophilicized surface of the gate insulating layer is exposed and transistor characteristics are diminished.

Patent Document 2 describes an organic thin film transistor in which a solution containing a polytitanometalloxane and 1-butanol is applied to the whole surface of the gate insulating layer composed of an organic compound; and a barrier layer with a high solvent resistance is formed. The gate insulating layer is protected by the barrier layer from a metal steam used for the formation of a metal layer, an etching liquid used in the patterning of a metal layer, an organic solvent used in the formation of an organic semiconductor layer and the like.

However, a polytitanometalloxane is highly chemically stable. Accordingly, in order to etch a polytitanometalloxane layer, it is necessary to use very strong alkali solution. Thus, if an alkali solution contacts an underlying organic layer, the surface of an organic layer is damaged.

BACKGROUND ART DOCUMENTS

Patent Document(s)

Patent Document 1: JP 2007-305950 A
Patent Document 2: WO 2007/99689 A

Non-Patent Document(s)

Non-Patent Document 1: Appl. Phys. Lett. 89, 093507 (2006)
Non-Patent Document 2: Appl. Phys. Lett. 92, 183306 (2008)

SUMMARY OF THE INVENTION

Problems to be Solved by the Invention

The present invention solves the above-mentioned problem in the prior art. The object of the present invention is to provide an electronic device insulating layer which may improve characteristics of an electronic device.

Means for Solving the Problems

That is, the present invention provides an electronic device insulating layer comprising a first insulating layer formed from a first insulating layer material and a second insulating layer formed on the first insulating layer from a second insulating layer material,
  the first insulating layer material is a material comprising:
  a photosensitive resin material (A); and
  a tungsten (V) alkoxide (B),
  the second insulating layer material is a material comprising a polymer compound (D) which contains:
  a repeating unit containing a cyclic ether structure; and
  a repeating unit represented by the formula (1):

[Chemical Formula 1]

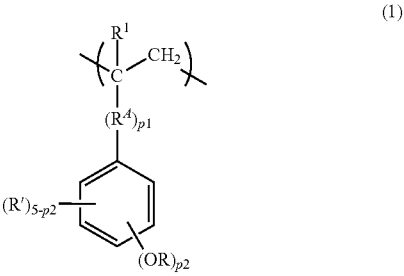

wherein $R^1$ represents a hydrogen atom or a methyl group; $R^4$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms; a hydrogen atom in the monovalent organic group having from 1 to 20 carbon atoms may have been substituted with a fluorine atom; p1 represents an integer of 0 or 1; p2 represents an integer of from 1 to 5; when there are two or more Rs, they may be the same or different; and when there are two or more R's, they may be the same or different.

In one embodiment, the above-mentioned first insulating layer material further contains a basic compound (C).

In one embodiment, the above-mentioned photosensitive resin material (A) is positive photosensitive resin material (A-1) or negative photosensitive resin material (A-2).

In one embodiment, the above-mentioned positive photosensitive resin material (A-1) is a photosensitive resin composition comprising:

a polymer compound (E) which contains a repeating unit containing a first functional group defined below and a repeating unit represented by the formula (2):

[Chemical Formula 2]

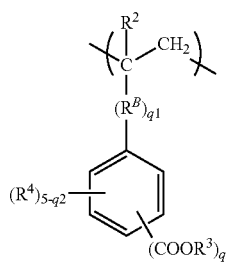

(2)

wherein $R^2$ represents a hydrogen atom or a methyl group; $R^B$ represents a linking moiety which links the main chain of the polymer compound with a side chain of the polymer compound and optionally has a fluorine atom; $R^3$ represents an organic group capable of being detached by an acid; $R^4$ represents a hydrogen atom or a monovalent organic group having from 1 to 20 carbon atoms; a hydrogen atom in the monovalent organic group having from 1 to 20 carbon atoms may have been substituted with a fluorine atom; q1 represents an integer of 0 or 1; q2 represents an integer of from 1 to 5; when there are two or more $R^3$s, they may be the same or different; and when there are two or more $R^{4s}$, they may be the same or different; and a compound (F) having a pyrolysis temperature of 200° C. or less, which is a compound capable of affording an acid by irradiating electromagnetic waves or an electron beam:

first functional group: a functional group capable of affording, by the action of electromagnetic waves or heat, a second functional group capable of reacting with active hydrogen.

In one embodiment, the first functional group is at least one group selected from the group consisting of an isocyanato group blocked with a blocking agent and an isothiocyanato group blocked with a blocking agent.

In one embodiment, the isocyanato group blocked with a blocking agent and the isothiocyanato group blocked with a blocking agent are groups selected from the group consisting of groups represented by the formula (3):

[Chemical Formula 3]

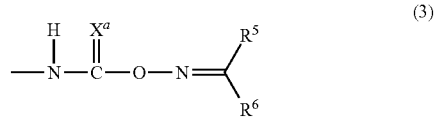

(3)

wherein $X^a$ represents an oxygen atom or a sulfur atom; and $R^5$ and $R^6$ each independently represent a hydrogen atom or a monovalent organic group having from 1 to 20 carbon atoms; and groups represented by the formula (4):

[Chemical Formula 4]

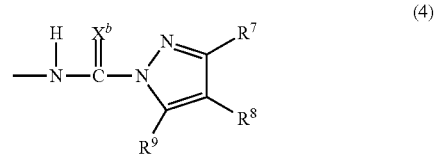

(4)

wherein $X^b$ represents an oxygen atom or a sulfur atom, and $R^7$, $R^8$ and $R^9$ each independently represent a hydrogen atom or a monovalent organic group having from 1 to 20 carbon atoms.

In one embodiment, the polymer compound (E) contains a repeating unit represented by the formula (5):

[Chemical Formula 5]

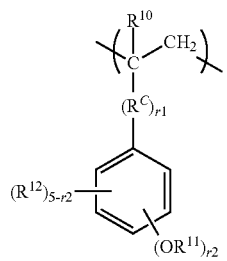

(5)

wherein $R^{10}$ represents a hydrogen atom or a methyl group; $R^c$ represents a linking moiety which links the main chain of the polymer compound with a side chain of the polymer compound and optionally has a fluorine atom; $R^{11}$ represents an organic group capable of being detached by an acid; $R^{12}$ represents a hydrogen atom or a monovalent organic group having from 1 to 20 carbon atoms; a hydrogen atom in the monovalent organic group having from 1 to 20 carbon atoms may have been substituted with a fluorine atom; r1 represents an integer of 0 or 1; r2 represents an integer of from 1 to 5; when there are two or more $R^{11}$s, they may be the same or different; and when there are two or more $R^{12}$s, they may be the same or different. Thus, the polymer compound (E) containing a repeating unit represented by the above-mentioned formula (5) may be hereinafter referred to as a polymer compound (E-1).

In one embodiment, the above-mentioned negative photosensitive resin material (A-2) is a photosensitive resin composition comprising:

a polymer compound (G) which contains a repeating unit containing a cyclic ether structure and a repeating unit represented by the formula (7):

[Chemical Formula 6]

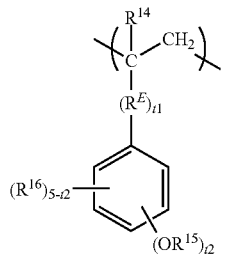

(7)

wherein $R^{14}$ represents a hydrogen atom or a methyl group; $R^E$ represents a linking moiety which links the main chain of the polymer compound with a side chain of the polymer compound and optionally has a fluorine atom; $R^{15}$ represents an organic group capable of being detached by an acid; $R^{16}$ represents a hydrogen atom or a monovalent organic group having from 1 to 20 carbon atoms; a hydrogen atom in the monovalent organic group having from 1 to 20 carbon atoms may have been substituted with a fluorine atom; t1 represents an integer of 0 or 1; t2 represents an integer of from 1 to 5; when there are two or more $R^{15}$s, they may be the same or different; and when there are two or more $R^{16}$s, they may be the same or different; and a compound (H) which is capable of affording an acid by irradiating an electromagnetic wave or an electron beam.

In one embodiment, the repeating unit having a cyclic ether structure contained in the above-mentioned polymer compound (G) is at least one repeating unit selected from the group consisting of a repeating unit represented by the formula (8):

[Chemical Formula 7]

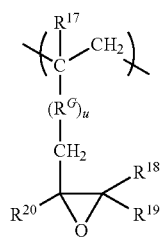

(8)

wherein $R^{17}$ represents a hydrogen atom or a methyl group; $R^{18}$, $R^{19}$ and $R^{20}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^G$ represents a linking moiety which links the main chain of the polymer compound with a side chain of the polymer compound and optionally has a fluorine atom; and u represents an integer of 0 or 1; and a repeating unit represented by the formula (9):

[Chemical Formula 8]

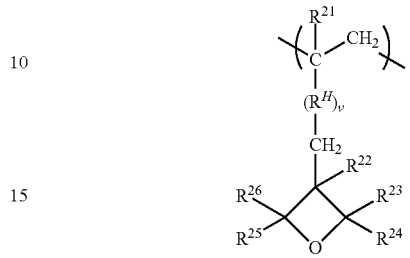

(9)

wherein $R^{21}$ represents a hydrogen atom or a methyl group; $R^{22}$, $R^{23}$, $R^{24}$, $R^{25}$ and $R^{26}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^H$ represents a linking moiety which links the main chain of the polymer compound with a side chain of the polymer compound and optionally has a fluorine atom; and v represents an integer of 0 or 1.

In one embodiment, the polymer compound (G) contains at least one repeating unit selected from the group consisting of repeating units containing a first functional group defined below. Such a polymer compound (G) may be hereinafter referred to as a polymer compound (G-1):

first functional group: a functional group capable of affording, by the action of electromagnetic waves or heat, a second functional group capable of reacting with active hydrogen.

In one embodiment, the second insulating layer material is an insulating layer material consisting of the polymer compound (D).

In one embodiment, the repeating unit having a cyclic ether structure contained in the above-mentioned polymer compound (D) is at least one repeating unit selected from the group consisting of a repeating unit represented by the formula (11):

[Chemical Formula 9]

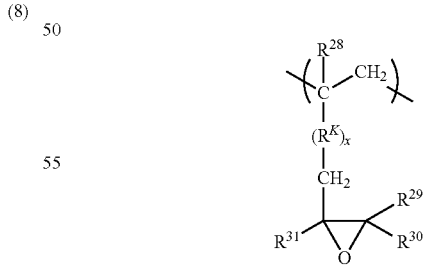

(11)

wherein $R^{28}$ represents a hydrogen atom or a methyl group; $R^{29}$, $R^{30}$ and $R^{31}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^K$ represents a linking moiety which links the main chain of the polymer compound with a side chain of the polymer compound and optionally has a fluorine atom; and x represents an integer of 0 or 1; and
a repeating unit represented by the formula (12):

[Chemical Formula 10]

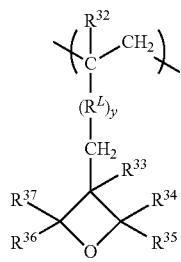

(12)

wherein $R^{32}$ represents a hydrogen atom or a methyl group; $R^{33}$, $R^{34}$, $R^{35}$, $R^{36}$ and $R^{37}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^L$ represents a linking moiety which links the main chain of the polymer compound with a side chain of the polymer compound and optionally has a fluorine atom; and y represents an integer of 0 or 1.

In one embodiment, the polymer compound (D) contains at least one repeating unit selected from the group consisting of a repeating unit represented by the formula (13):

[Chemical Formula 11]

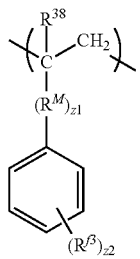

(13)

wherein $R^{38}$ represents a hydrogen atom or a methyl group; $R^{f3}$ represents a fluorine atom or a monovalent organic group which has from 1 to 20 carbon atoms and optionally has a fluorine atom; $R^M$ represents a linking moiety which links the main chain of the polymer compound with a side chain of the polymer compound and optionally has a fluorine atom; z1 represents an integer of 0 or 1; z2 represents an integer of from 1 to 5; when there are two or more $R^{f3}$s, they may be the same or different provided that at least one $R^{f3}$ is a fluorine atom or a monovalent organic group having from 1 to 20 carbon atoms and a fluorine atom, and
a repeating unit containing the first functional group. Such a polymer compound (D) may be hereinafter referred to as a polymer compound (D-1).

In one embodiment, the above-mentioned electronic device insulating layer is an organic thin film transistor insulating layer.

Furthermore, the present invention provides a production process of an electronic device insulating layer comprising the steps of:

applying a solution containing a first insulating layer material and a solvent to a substrate to form a first coated layer on the substrate;
irradiating a part of the first coated layer with electromagnetic waves or an electron beam;
removing a part of the first coated layer irradiated with electromagnetic waves or an electron beam to form a pattern on the first coated layer;
applying heat to the first coated layer on which the pattern is formed to form a first insulating layer;
forming a patterned electrode on the first insulating layer;
applying a solution containing a second insulating layer material and a solvent to the patterned electrode and the first insulating layer to form a second coated layer;
applying heat to the first insulating layer and the second coated layer; and
removing a part of the second coated layer formed on the patterned electrode to form a second insulating layer, and
the first insulating layer material is a material comprising
a photosensitive resin material (A), and
a tungsten (V) alkoxide (B),
the second insulating layer material is a material comprising a polymer compound (D) which contains:
a repeating unit containing a cyclic ether structure; and
a repeating unit represented by the formula (1):

[Chemical Formula 12]

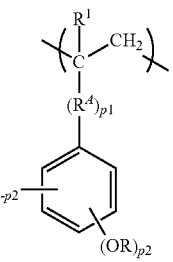

(1)

wherein $R^1$ represents a hydrogen atom or a methyl group; $R^A$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms; a hydrogen atom in the monovalent organic group having from 1 to 20 carbon atoms may have been substituted with a fluorine atom; p1 represents an integer of 0 or 1; p2 represents an integer of from 1 to 5; when there are two or more Rs, they may be the same or different; and when there are two or more R's, they may be the same or different.

Furthermore, the present invention provides a process for producing an electronic device insulating layer comprising the steps of:

applying a solution containing a first insulating layer material and a solvent to a substrate to form a first coated layer on the substrate;
irradiating a part of the first coated layer with electromagnetic waves or an electron beam;
removing a part of the first coated layer which is not irradiated with electromagnetic waves or an electron beam to form a pattern in the first coated layer;
applying heat to the first coated layer in which the pattern is formed to form a first insulating layer;

forming a patterned electrode on the first insulating layer;
applying a solution containing a second insulating layer material and a solvent to the patterned electrode and the first insulating layer to form a second coated layer;
applying heat to the first insulating layer and the second coated layer; and
removing a part of the second coated layer formed on the patterned electrode to form a second insulating layer, and
the first insulating layer material is a material comprising:
a photosensitive resin material (A); and
a tungsten (V) alkoxide (B), and
the second insulating layer material is a material comprising a polymer compound (D) which contains:
a repeating unit containing a cyclic ether structure; and
a repeating unit represented by the formula (1):

[Chemical Formula 13]

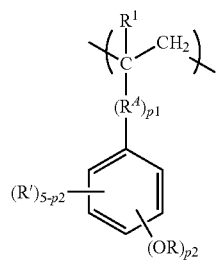

(1)

wherein $R^1$ represents a hydrogen atom or a methyl group; $R^A$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms and optionally having a fluorine atom; b represents an integer of 0 or 1; n represents an integer of from 1 to 5; when there are two or more Rs, they may be the same or different; and when there are two or more R's, they may be the same or different.

In one embodiment, the above-mentioned electromagnetic wave is ultraviolet ray.

The present invention provides an electronic device insulating layer produced by the process described above.

In one embodiment, the electronic device insulating layer is an organic thin film transistor insulating layer.

The present invention provides an organic thin film transistor comprising a gate electrode, a sauce electrode, a drain electrode, an organic semiconductor layer and the electronic device insulating layer described above.

Further, the present invention provides a display member comprising the electronic device insulating layer described above.

Further, the present invention provides a display comprising the display member described above.

Effect of the Invention

The organic thin film transistor in which the electronic device insulating layer of the present invention is used as an insulating layer has a small hysteresis.

In addition, in the electronic device insulating layer of the present invention, the patterning of an electronic device insulating layer may be carried out by a simple process.

Furthermore, in the electronic device insulating layer of the present invention, even when a step such as a step of patterning of an electronic device insulating layer and a step of forming an electrode on an electronic device insulating layer in which the surface of an electronic device insulating layer is damaged is carried out, such a damage does not remain on the surface of the electronic device insulating layer.

EMBODIMENTS FOR CARRYING OUT THE INVENTION

Figure 1:
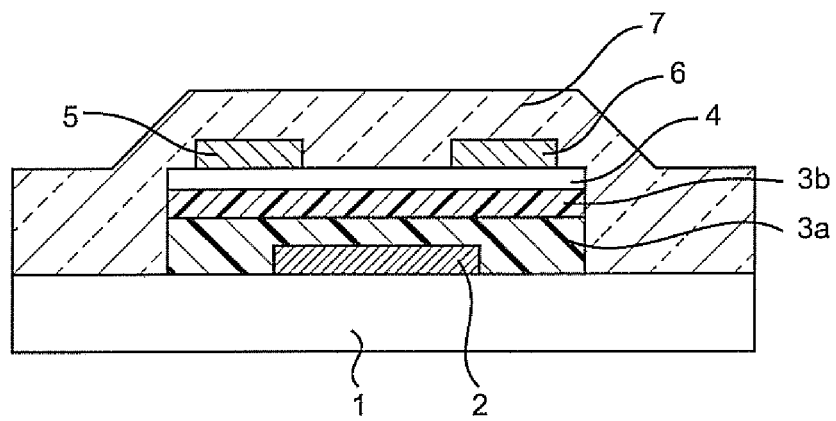
FIG. 1 a schematic cross-sectional view showing a structure of a bottom-gate/top-contact organic thin film transistor which is one embodiment of the present invention.

Then, the present invention is further described in detail.

In the specification, a "polymer compound" refers to any compound including a structure in which two or more identical structural units are repeated in a molecule, and this includes a so-called dimer. On the other hand, a "low-molecular compound" means any compound which does not have identical structural units repeatedly in a molecule.

An organic thin film transistor in which the electronic device insulating layer of the present invention is used comprises a gate electrode, a sauce electrode, a drain electrode, an organic semiconductor layer, a first insulating layer formed from a first insulating layer material and a second insulating layer formed on the first insulating layer from a second insulating layer material.

The first insulating layer material contains a photosensitive resin material (A) and a tungsten (V) alkoxide (B).

Unlike the first insulating layer material, the second insulating layer material comprises a polymer compound (D) containing a repeating unit having a cyclic ether structure and a repeating unit represented by the formula (1). The second insulating layer material may contain only a compound which differs from a compound capable of affording an acid by the action of electromagnetic waves or heat as an optional component.

(First Insulating Layer Material)
<Photosensitive Resin Material (A)>

As the photosensitive resin material (A) used in the present invention, a positive photosensitive resin material (A-1) and a negative photosensitive resin material (A-2) are preferred.

As the positive photosensitive resin material (A-1), a photosensitive resin material which contains a polymer compound (E) containing a repeating unit having a first functional group and a repeating unit represented by the formula (2), and a compound (F) having a pyrolysis temperature of 200° C. or less, which is a compound capable of affording an acid by irradiating electromagnetic waves or an electron beam, is preferred. The above-mentioned first functional group refers to a functional group capable of affording, by the action of electromagnetic waves or heat, a second functional group capable of reacting with active hydrogen. Polymer Compound (E)

In the formula (2), $R^2$ represents a hydrogen atom or a methyl group. In one embodiment, $R^2$ is a hydrogen atom.

In the formula (2), $R^B$ represents a linking moiety which links the main chain of the polymer compound with a side chain of the polymer compound and optionally has a fluorine atom. The linking moiety may be a divalent group having a structure which does not exhibit reactivity under environmental conditions which cross-link the insulating layer material used in the present invention. Examples of the linking moiety include a bond formed from a divalent organic group having from 1 to 20 carbon atoms, an ether bonding (—O—), a ketone bonding (—CO—), an ester bonding (—COO—, —OCO—), an amide bonding (—NHCO—, —CONH—), a urethane bonding (—NHCOO—, —OCONH—), and bondings in combination of these bondings. q1 represents an integer of 0 or 1. In one embodiment, q1 is 0.

The divalent organic group, represented by $R^B$ and having from 1 to 20 carbon atoms, may be linear, branched or cyclic, and may be an aliphatic hydrocarbon group or an aromatic hydrocarbon group. Examples of the divalent organic group having from 1 to 20 carbon atoms include divalent linear aliphatic hydrocarbon groups having from 1 to 20 carbon atoms, divalent branched aliphatic hydrocarbon groups having from 3 to 20 carbon atoms, divalent cyclic hydrocarbon groups having from 3 to 20 carbon atoms and divalent aromatic hydrocarbon groups having from 6 to 20 carbon atoms and optionally having been substituted with an alkyl group or the like. Among these groups, divalent linear aliphatic hydrocarbon groups having from 1 to 6 carbon atoms, divalent branched aliphatic hydrocarbon groups having from 3 to 6 carbon atoms, divalent cyclic hydrocarbon groups having from 3 to 6 carbon atoms, and divalent aromatic hydrocarbon groups having from 6 to 20 carbon atoms and optionally having been substituted with an alkyl group or the like are preferred.

Examples of the divalent linear aliphatic hydrocarbon groups, the divalent branched aliphatic hydrocarbon groups and the divalent cyclic hydrocarbon groups include a methylene group, an ethylene group, a propylene group, a butylene group, a pentylene group, a hexylene group, an isopropylene group, an isobutylene group, a dimethylpropylene group, a cyclopropylene group, a cyclobutylene group, a cyclopentylene group and a cyclohexylene group.

Examples of the divalent aromatic hydrocarbon groups having from 6 to 20 carbon atoms and optionally having been substituted with an alkyl group or the like include a phenylene group, a naphthylene group, an anthrylene group, a dimethylphenylene group, a trimethylphenylene group, an ethylenephenylene group, a diethylenephenylene group, a triethylenephenylene group, a propylenephenylene group, a butylenephenylene group, a methylnaphthylene group, a dimethylnaphthylene group, a trimethylnaphthylene group, a vinylnaphthylene group, an ethenylnaphthylene group, a methylanthrylene group and an ethylanthrylene group.

In the formula (2), $R^4$ represents a hydrogen atom or a monovalent organic group having from 1 to 20 carbon atoms. The monovalent organic group having from 1 to 20 carbon atoms may be linear, branched or cyclic, and may be saturated or unsaturated. A hydrogen atom in the monovalent organic group having from 1 to 20 carbon atoms may have been substituted with a fluorine atom.

Examples of the monovalent organic group represented by $R^4$ and having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom contained in the linear hydrocarbon groups having from 1 to 20 carbon atoms, the branched hydrocarbon groups having from 3 to 20 carbon atoms and the cyclic hydrocarbon groups having from 3 to 20 carbon atoms has optionally been substituted with a fluorine atom.

Any hydrogen atom in the aromatic hydrocarbon groups having from 6 to 20 carbon atoms has optionally been substituted with an alkyl group, a fluorine atom, a chlorine atom, a bromine atom and an iodine atom.

Specific examples of the monovalent organic group having from 1 to 20 carbon atoms include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

An alkyl group is preferred as the monovalent organic group having from 1 to 20 carbon atoms.

In the formula (2), $R^3$ represents an organic group capable of being detached by an acid. This means that when an acid acts on a —COOR$^3$ group in the formula (2), an $R^3$ group is detached to produce a —COOH group. In this case, the polymer compound (E) exhibits acidity and thus exhibits solubility to an alkali solution.

Examples of the organic group capable of being detached by an acid represented by $R^3$ include hydrocarbon groups having a branched structure or a cyclic hydrocarbon structure and from 4 to 20 carbon atoms, a hydrofuranyl group which may be substituted and a hydropyranyl group which may be substituted.

Examples of the hydrocarbon group having a branched structure and 4 to 20 carbon atoms include a tertiary butyl group, 2,3-dimethyl-2-butyl group and 2,3,3-trimethyl-2-butyl group.

Examples of the hydrocarbon group having a cyclic hydrocarbon structure and 4 to 20 carbon atoms include a 2-cyclopropyl-2-propyl group, a 1-methyl-1-cyclopentyl group, a 1-methyl-1-cyclohexyl group, a 1-methyl-1-cycloheptanyl group, a 2-methyl-2-adamanthyl group and a 2-adamanthyl-2-propyl group.

Examples of the substituent which may be contained in a hydrofuranyl group and a hydropyranyl group include a hydroxyl group, an alkoxy group and an alkyl group.

The hydrofuranyl group means a group obtained by eliminating one hydrogen atom from dihydrofuran or tetrahydrofuran. Examples of the hydrofuranyl group which may be substituted include a tetrahydrofuranyl group.

The hydropyranyl group means a group obtained by eliminating one hydrogen atom from dihydropyran or tetrahydropyran. Examples of the hydropyranyl group which may be substituted include a tetrahydropyranyl group and a 4-methoxy tetrahydropyranyl group.

In the formula (2), q2 represents an integer of 1 to 5. In one embodiment, q2 is 1.

The polymer compound (E) contains a repeating unit containing a first functional group. Although the first functional group does not react with active hydrogen, when the first functional group is subjected to the action of electromagnetic wave or heat, the second functional group is produced and reacts with active hydrogen. That is, the first functional group is deprotected by the action of electromagnetic waves or heat and may afford the second functional group capable of reacting with active hydrogen. An "active hydrogen" as used in the present specification means a hydrogen atom bonded to an oxygen atom, a sulfur atom or a nitrogen atom.

If a cross-linked structure is formed inside an organic thin film transistor insulating layer, the movement of the molecular structure is inhibited, and thus the polarization of the insulating layer is inhibited. If the polarization of the insulating layer is inhibited, when, for example, the insulating layer is used as a gate insulating layer, the absolute value of threshold voltage of an organic thin film transistor is lowered and operation accuracy is improved.

Examples of the active hydrogen-containing group contained in the polymer compound (E) include a carboxyl group which is produced by that $R^3$ is detached from the —$COOR^3$ in the formula (2) by the action of an acid afforded from the compound (F) capable of affording an acid. Otherwise, the examples include a hydroxyl group which is produced by that $R^{11}$ is detached from the —$OR^{11}$ in the formula (5) by the action of an acid afforded from the compound (F) capable of affording an acid.

The first functional group is protected (blocked) and the first functional group is present in the form of the first functional group in the first insulating layer material until electromagnetic waves or heat are applied in the step of forming the first gate insulating layer. As a result, storage stability of the first insulating layer material is improved.

Preferred examples of the first functional group include an isocyanato group blocked with a blocking agent and an isothiocyanato group blocked with a blocking agent.

The above-mentioned isocyanato group blocked with a blocking agent can be produced by the reaction of a blocking agent having only one active hydrogen capable of reacting with an isocyanato group in a molecule with an isocyanato group.

The above-mentioned isothiocyanato group blocked with a blocking agent can be produced by the reaction of a blocking agent having only one active hydrogen capable of reacting with an isothiocyanato group in a molecule with an isothiocyanato group.

As the blocking agent, one which dissociates at a temperature of 170° C. or lower even after reacting with an isocyanato group or an isothiocyanato group is preferred. Examples of the blocking agent include alcohol type compounds, phenol type compounds, active methylene type compounds, mercaptan type compounds, acid amide type compounds, acid imide type compounds, imidazole type compounds, urea type compounds, oxime type compounds, amine type compounds, imine type compounds, bisulfites, pyridine type compounds and pyrazole type compounds. These blocking agents may be used alone or may be used as a mixture of two or more of them. Preferred blocking agent includes oxime type compounds and pyrazole type compounds.

Specific examples of the blocking agents are shown below. Examples of the alcohol type compounds include methanol, ethanol, propyl alcohol, butanol, 2-ethylhexanol, methylcellosolve, butylcellosolve, methylcarbitol, benzyl alcohol and cyclohexanol. Examples of the phenol type compounds include phenol, cresol, ethylphenol, butylphenol, nonylphenol, dinonylphenol, styrenated phenol and hydroxybenzoic acid esters. Examples of the active methylene type compounds include dimethyl malonate, diethyl malonate, methyl acetoacetate, ethyl acetoacetate and acetylacetone. Examples of the mercaptan type compounds include butyl mercaptan and dodecylmercaptan. Examples of the acid amide type compounds include acetanilide, acetic acid amide, ε-caprolactam, δ-valerolactam and γ-butyrolactam. Examples of the acid imide type compounds include succinimide and maleimide. Examples of the imidazole type compounds include imidazole and 2-methylimidazole. Examples of the urea type compounds include urea, thiourea and ethyleneurea. Examples of the oxime type compounds include formaldoxime, acetaldoxime, acetoxime, methylethylketoxime and cyclohexanone oxime. Examples of the amine type compounds include diphenylamine, aniline and carbazole. Examples of the imine type compounds include ethyleneimine and polyethyleneimine. Examples of the bisulfites include sodium bisulfite. Examples of the pyridine type compounds include 2-hydroxypyridine and 2-hydroxyquinoline. Examples of the pyrazole type compounds include 3,5-dimethylpyrazole and 3,5-diethylpyrazole.

As the isocyanato group blocked with a blocking agent and the isothiocyanato group blocked with a blocking agent, which may be respectively used in the present invention, a group represented by the formula (3) and a group represented by the formula (4) are preferred.

In the formula (3) and the formula (4), $X^a$ represents an oxygen atom or a sulfur atom, $X^b$ represents an oxygen atom or a sulfur atom, and $R^5$, $R^6$, $R^7$, $R^8$ and $R^9$ each independently represent a hydrogen atom or a monovalent organic group having from 1 to 20 carbon atoms.

The definition and specific examples of the monovalent organic groups, represented by $R^5$, $R^6$, $R^7$, $R^8$ and $R^9$ and having from 1 to 20 carbon atoms, are the same as the definition and specific examples of the monovalent organic groups, represented by the above-mentioned $R^4$ and having from 1 to 20 carbon atoms.

In one embodiment, $R^5$ is a methyl group, $R^6$ is an ethyl group, $R^7$, $R^8$ and $R^9$ are hydrogen atoms.

Examples of the isocyanato group blocked with a blocking agent include an O-(methylideneamino)carboxyamino group, an O-(1-ethylideneamino)carboxyamino group, an O-(1-methylethylideneamino)carboxyamino group, an O-[1-methylpropylideneamino]carboxyamino group, an (N-3,5-dimethylpyrazolylcarbonyl)amino group, an (N-3-ethyl-5-methylpyrazolylcarbonyl)amino group, an (N-3,5-diethylpyrazolylcarbonyl)amino group, an (N-3-propyl-5-methylpyrazolylcarbonyl)amino group and an (N-3-ethyl-5-propylpyrazolylcarbonyl)amino group.

Examples of the isothiocyanato group blocked with a blocking agent include an O-(methylideneamino)thiocarboxyamino group, an O-(1-ethylideneamino)thiocarboxyamino group, an O-(1-methylethylideneamino)thiocarboxyamino group, an O-[1-methylpropylideneamino]thiocarboxyamino group, an (N-3,5-dimethylpyrazolylthiocarbonyl)amino group, an (N-3-ethyl-5-methylpyrazolylthiocarbonyl)amino group, an (N-3,5-diethylpyrazolylthiocarbonyl)amino group, an (N-3-propyl-5-methylpyrazolylthiocarbonyl)amino group and an (N-3-ethyl-5-propylpyrazolylthiocarbonyl)amino group.

An isocyanato group blocked with a blocking agent is preferred as the first functional group.

As the polymer compound (E) used in the present invention, a polymer compound further containing a repeating unit represented by the formula (5), i.e., the above-mentioned polymer compound (E-1) is preferred.

In the formula (5), $R^{10}$ represents a hydrogen atom or a methyl group. In one embodiment, $R^{10}$ is a hydrogen atom.

In the formula (5), $R^c$ represents a linking moiety which links the main chain with a side chain and optionally has a fluorine atom. The definition and specific examples of the linking moiety represented by $R^c$ are the same as the definition and specific examples of the linking moiety represented by $R^B$. r1 represents an integer of 0 or 1. In one embodiment, r1 is 0.

In the formula (5), $R^{11}$ represents an organic group capable of being detached by an acid. The organic group capable of being detached by an acid represented by $R^{11}$ is an organic group which is detached by the action of an acid to produce a phenolic hydroxyl group. A phenolic hydroxyl group is able to terminate cation polymerization of the polymer compound (E-1) or to reduce the reaction rate of the cation polymerization due to chain transfer, and may suppress the polymer compound (E-1) to excessively progress in cation polymerization in the presence of an acid.

Examples of the organic group capable of being detached by an acid represented by $R^{11}$ include alkoxyalkyl groups having from 2 to 20 carbon atoms and optionally having been substituted, a hydrofuranyl group optionally having been substituted, a hydropyranyl group optionally having been substituted and groups having from 3 to 20 carbon atoms and having a cyclic hydrocarbon structure.

Examples of the substituent which may be contained in the alkoxyalkyl groups having from 2 to 20 carbon atoms include alkoxy groups having from 1 to 20 carbon atoms, alkyl groups having from 1 to 20 carbon atoms, halogen atoms and phenyl groups. Examples of the alkoxyalkyl groups having from 2 to 20 carbon atoms and optionally having been substituted include a methoxy methyl group, a methoxyethoxy methyl group, a 1-ethoxyethyl group, a 2-ethoxyethyl group, a bis(2-chloroethoxy)methyl group, a 1-methyl-1-methoxyethyl group and a 1-isopropoxyethyl group.

Examples of the substituent which may be contained in the hydrofuranyl group and a hydropyranyl group include a hydroxyl group, alkoxy groups having from 1 to 20 carbon atoms and alkyl groups having from 1 to 20.

The hydrofuranyl group means a group obtained by eliminating one hydrogen atom from dihydrofuran or tetrahydrofuran. Examples of the hydrofuranyl group optionally having been substituted include a tetrahydrofuranyl group.

The hydropyranyl group means a group obtained by eliminating one hydrogen atom from dihydropyran or tetrahydropyran. Examples of the hydropyranyl group optionally having been substituted include a tetrahydropyranyl group and a 4-methoxy tetrahydropyranyl group.

Examples of the groups having from 3 to 20 carbon atoms and having a cyclic hydrocarbon structure include a 1-cyclopropyl-1-methylethyl group, a 1-methyl-1-cyclopentyl group, a 1-methyl-1-cyclohexyl group, a 1-methyl-1-cycloheptanyl group, a 2-methyl-2-adamanthyl group and a 1-methyl-1-(2-adamanthyl)ethyl group.

In the formula (5), r2 represents an integer of 1 to 5. In one embodiment, r2 is 1.

In the formula (5), $R^{12}$ represents a hydrogen atom or a monovalent organic group having from 1 to 20 carbon atoms. A hydrogen atom in the monovalent organic group having from 1 to 20 carbon atoms may have been substituted with a fluorine atom.

The definition and the specific examples of the monovalent organic group having from 1 to 20 carbon atoms represented by $R^{12}$ are the same as the definition and the specific examples of the above-mentioned monovalent organic group having from 1 to 20 carbon atoms represented by $R^4$.

The polymer compound (E) or (E-1) may further contain a repeating unit represented by the formula (6):

[Chemical Formula 14]

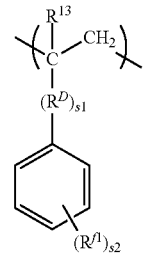

(6)

In the formula (6), $R^{13}$ represents a hydrogen atom or a methyl group.

In one embodiment, $R^{13}$ is a hydrogen atom.

In the formula (6), $R^D$ represents a linking moiety which links the main chain with a side chain and optionally has a fluorine atom. The definition and specific examples of the linking moiety represented by $R^D$ are the same as the definition and specific examples of the linking moiety represented by $R^B$. s1 represents an integer of 0 or 1. In one embodiment, s1 is 0.

In the formula (6), $R^{f1}$ represents a fluorine atom or a monovalent organic group having from 1 to 20 carbon atoms and optionally having a fluorine atom. In one embodiment, $R^{f1}$ is a fluorine atom.

By introducing fluorine into the insulating layer material, the insulating layer formed of the insulating layer material has low polarity and the polarization of the insulating layer is suppressed.

A fluorine atom is preferably substituted for a hydrogen atom of a side chain or a side group (a pendant group) of a polymer compound, rather than for a hydrogen atom of the main chain of the polymer compound. In the insulating layer material in which a fluorine atom is substituted at the side chain or the side group, affinity for other organic materials such as an organic semiconductor compound does not diminished. In addition, when a layer including the organic materials is formed in contact with the insulating layer, the organic materials well contact an exposed surface of the insulating layer, and this facilitates formation of a layer.

s2 represents an integer of 1 to 5. In one embodiment, s2 is 5.

The monovalent organic group represented by $R^{f1}$, having from 1 to 20 carbon atoms, has optionally fluorine atom, may be linear, branched or cyclic, and may be saturated or unsaturated.

Examples of the monovalent organic group having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms, aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms, aromatic hydrocarbon groups having from 6 to 20 carbon atoms.

Any hydrogen atom in the aromatic hydrocarbon groups having from 6 to 20 carbon atoms may have been substituted with an alkyl group, a chlorine atom, a bromine atom, an iodine atom.

When $R^{f1}$ is a monovalent organic group having from 1 to 20 carbon atoms and not having a fluorine atom, specific examples of the monovalent organic group having from 1 to 20 carbon atoms and not having a fluorine atom include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

Among the monovalent organic group having from 1 to 20 carbon atoms and not having a fluorine atom, an alkyl group is preferred.

When $R^{f1}$ is an organic group having from 1 to 20 carbon atoms and having a fluorine atom, examples of the monovalent organic group having from 1 to 20 carbon atoms and having a fluorine atom include a trifluoromethyl group, a 2,2,2-trifluoroethyl group, a 2,2,3,3,3-pentafluoropropyl group, a 2-(perfluorobutyl)ethyl group, a pentafluorophenyl group and a trifluoromethylphenyl group.

As the monovalent organic group represented by $R^{f1}$, having from 1 to 20 carbon atoms and optionally having a fluorine atom, an alkyl group substituted with a fluorine atom is preferred.

In the formula (6), at least one $R^{f1}$ is a fluorine atom or a monovalent organic group having from 1 to 20 carbon atoms and having a fluorine atom. Preferably, s2 is 5, and five $R^{f1}$s are fluorine atoms, or monovalent organic groups having from 1 to 20 carbon atoms and a fluorine atom.

The polymer compound (E) may be produced by, for example, a method of copolymerizing, by using a photopolymerization initiator or a thermal polymerization initiator, a polymerizable monomer mixture containing a polymerizable monomer containing the first functional group and a polymerizable monomer serving as a raw material of a repeating unit represented by the formula (2).

Examples of the polymerizable monomer containing the first functional group include monomers having either the isocyanato group blocked with a blocking agent or the isothiocyanato group blocked with a blocking agent and an unsaturated bond. The monomers having either the isocyanato group blocked with a blocking agent or the isothiocyanato group blocked with a blocking agent, and an unsaturated bond may be produced by the reaction of a compound having an isocyanato group or an isothiocyanato group and an unsaturated bond with a blocking agent. A double bond is preferred as the unsaturated bond.

Examples of the compound having a double bond and an isocyanato group include 2-acryloyloxyethylisocyanate, 2-methacryloyloxyethylisocyanate and 2-(2'-methacryloyloxyethyl)oxyethylisocyanate. Examples of the compound having a double bond and an isothiocyanato group include 2-acryloyloxyethylisothiocyanate, 2-methacryloyloxyethylisothiocyanate and 2-(2'-methacryloyloxyethyl)oxyethylisothiocyanate.

The above-mentioned blocking agents can be suitably used for producing the polymerizable monomer containing the first functional group. In the reaction of producing the monomers having either the isocyanato group blocked with a blocking agent or the isothiocyanato group blocked with a blocking agent, and an unsaturated bond by reacting the compound having either an isocyanato group or an isothiocyanato group, and an unsaturated bond with a blocking agent, an organic solvent, a catalyst, etc. may be added.

Examples of the above-mentioned monomer having the isocyanato group blocked with a blocking agent and a double bond include 2-[O-[1'-methylpropylideneamino]carboxyamino]ethyl-methacrylate and 2-[N-[1',3'-dimethylpyrazolyl]carbonylamino]ethyl-methacrylate.

Examples of the above-mentioned monomer having the isothiocyanato group blocked with a blocking agent and a double bond include 2-[O-[1'-methylpropylideneamino]thiocarboxyamino]ethyl-methacrylate and 2-[N-[1',3'-dimethylpyrazolyl]thiocarbonylamino]ethyl-methacrylate.

Examples of the photopolymerization initiator include carbonyl compounds such as acetophenone, 2,2-dimethoxy-2-phenylacetophenone, 2,2-diethoxyacetophenone, 4-isopropyl-2-hydroxy-2-methylpropiophenone, 2-hydroxy-2-methylpropiophenone, 4,4'-bis(diethylamino) benzophenone, benzophenone, methyl(ortho-benzoyl) benzoate, 1-phenyl-1,2-propanedione-2-(O-ethoxycarbonyl)oxime, 1-phenyl-1,2-propanedione-2-(ortho-benzoyl)oxime, benzoin, benzoin methyl ether, benzoin ethyl ether, benzoin isopropyl ether, benzoin isobutyl ether, benzoin octyl ether, benzil, benzyl dimethyl ketal, benzyl diethyl ketal, and diacetyl; derivatives of anthraquinone or thioxanthone, such as methylanthraquinone, chloroanthraquinone, chlorothioxanthone, 2-methylthioxanthone, and 2-isopropylthioxanthone; and sulfur compounds, such as diphenyldisulfide and dithiocarbamate.

When light energy is used as energy to initiate copolymerization, the wavelength of light for irradiation of the polymerizable monomer is 360 nm or more, preferably from 360 to 450 nm.

The thermal polymerization initiator may be any compound that can serve as an initiator of radical polymerization, and examples thereof include azo type compounds, such as 2,2'-azobisisobutyronitrile, 2,2'-azobisisovaleronitrile, 2,2'-azobis(2,4-dimethylvaleronitrile), 4,4'-azobis(4-cyanovaleric acid), 1,1'-azobis(cyclohexanecarbonitrile), 2,2'-azobis(2-methylpropane), and 2,2'-azobis(2-methylpropionamidine)dihydrochloride; ketone peroxides, such as methyl ethyl ketone peroxide, methyl isobutyl ketone peroxide, cyclohexanone peroxide, and acetylacetone peroxide; diacyl peroxides, such as isobutyl peroxide, benzoyl peroxide, 2,4-dichlorobenzoyl peroxide, o-methylbenzoyl peroxide, lauroyl peroxide, and p-chlorobenzoyl peroxide; hydroperoxides, such as 2,4,4-trimethylpentyl-2-hydroperoxide, diisopropylbenzene hydroperoxide, cumene hydroperoxide, and tertiary (tert)-butyl hydroperoxide; dialkyl peroxides, such as dicumyl peroxide, tert-butylcumyl peroxide, di-tert-butyl peroxide, and tris(tert-butylperoxy)triazine; peroxyketals, such as 1,1-di-tert-butylperoxycyclohexane and 2,2-di(tert-butylperoxy)butane; alkyl peresters, such as tert-butyl peroxypivalate, tert-butyl peroxy-2-ethylhexanoate, tert-butyl peroxyisobutylate, di-tert-butyl peroxyhexahydroterephthalate, di-tert-butyl peroxyazelate, tert-butyl peroxy-3,5,5-trimethylhexanoate, tert-butyl peroxyacetate, tert-butyl peroxybenzoate, and di-tert-butyl peroxytrimethyladipate; and peroxycarbonates, such as diisopropyl peroxydicarbonate, di-sec-butyl peroxydicarbonate, and tert-butyl peroxyisopropylcarbonate.

Examples of polymerization monomers serving as a raw material of the repeating unit represented by the formula (2) include tertiary butyl-4-vinyl benzoate, (2-methyl-2-adamanthyl)-4-vinyl benzoate, and (tetrahydro-2-pyranyl)-4-vinyl benzoate.

The polymer compound (E-1) which is one embodiment of the polymer compound (E) may be produced, for example, by the same method as the above-mentioned production of the polymer compound (E) by using a polymerizable monomer mixture containing at least one polymerizable monomer selected from the group consisting of a polymerizable monomer serving as a raw material of a repeating unit represented by the formula (5) and a polymerizable monomer serving as a raw material of a repeating unit represented by the formula (6) in addition to a polymerizable monomer containing the first functional group and a polymerizable monomer serving as a raw material of a repeating unit represented by the formula (2)

Examples of the polymerizable monomer serving as a raw material of a repeating unit represented by the formula (5) include 4-(methoxymethoxy)styrene, 4-(methoxyethoxymethoxy)styrene, 4-(1-ethoxyethoxy)styrene, 4-(2-tetrahydropyranyloxy)styrene, 4-(cyclopropylmethoxy)styrene and 4-(cyclohexyloxy)styrene.

Examples of the polymerizable monomer serving as a raw material of a repeating unit represented by the formula (6) include 2-trifluoromethylstyrene, 3-trifluoromethylstyrene, 4-trifluoromethylstyrene, 2,3,4,5,6-pentafluorostyrene and 4-fluorostyrene.

The polymer compound (E) may also be produced by adding, in polymerization, additional polymerizable monomers other than the polymerizable monomer containing the first functional group, the polymerizable monomer serving as a raw material of a repeating unit represented by the formula (2), the polymerizable monomer serving as a raw material of a repeating unit represented by the formula (5) and the polymerizable monomer serving as a raw material of a repeating unit represented by the formula (6).

Examples of the additional polymerizable monomers to be used in the production of the polymer compound (E) include acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, organic germanium derivatives containing an unsaturated hydrocarbon group and a vinyl-1,3-dioxolan-2-on and derivatives thereof.

The kind of the additional polymerizable monomer to be used is appropriately selected according to the property required of an insulating layer. From the viewpoint of excellent solvent resistance or reduced hysteresis of an organic thin film transistor, a monomer which forms a hard film having a high molecular density in a film containing a polymer compound obtained by the polymerization, such as styrene or styrene derivatives, is selected. Further, from the viewpoint of adhesiveness to a surface adjacent to the insulating layer, such as a surface of the gate electrode or the substrate or the like, a monomer, which imparts plasticity to the polymer compound (E), such as methacrylic acid esters and derivatives thereof, acrylic acid esters and derivatives thereof, is selected.

The acrylic acid esters and derivatives thereof may be monofunctional acrylates, or may be multifunctional acrylates even though an amount to be used thereof is limited. Examples of the acrylic acid esters and derivatives thereof include methyl acrylate, ethyl acrylate, n-propyl acrylate, isopropyl acrylate, n-butyl acrylate, isobutyl acrylate, sec-butyl acrylate, hexyl acrylate, octyl acrylate, 2-ethylhexyl acrylate, decyl acrylate, isobornyl acrylate, cyclohexyl acrylate, phenyl acrylate, benzyl acrylate, 2-hydroxyethyl acrylate, 2-hydroxypropyl acrylate, 3-hydroxypropyl acrylate, 2-hydroxybutyl acrylate, 2-hydroxyphenylethyl acrylate, ethylene glycol diacrylate, propylene glycol diacrylate, 1,4-butanediol diacrylate, diethylene glycol diacrylate, triethylene glycol diacrylate, trimethylolpropane diacrylate, trimethylolpropane triacrylate, pentaerythritol pentaacrylate, 2,2,2-trifluoroethyl acrylate, 2,2,3,3,3-pentafluoropropyl acrylate, 2-(perfluorobutyl)ethyl acrylate, 3-perfluorobutyl-2-hydroxypropyl acrylate, 2-(perfluorohexyl)ethyl acrylate, 3-perfluorohexyl-2-hydroxypropyl acrylate, 2-(perfluorooctyl)ethyl acrylate, 3-perfluorooctyl-2-hydroxypropyl acrylate, 2-(perfluorodecyl)ethyl acrylate, 2-(perfluoro-3-methylbutyl)ethyl acrylate, 3-(perfluoro-3-methylbutyl)-2-hydroxypropyl acrylate, 2-(perfluoro-5-methylhexyl)ethyl acrylate, 2-(perfluoro-3-methylbutyl)-2-hydroxypropyl acrylate, 3-(perfluoro-5-methylhexyl)-2-hydroxypropyl acrylate, 2-(perfluoro-7-methyloctyl)ethyl acrylate, 3-(perfluoro-7-methyloctyl)-2-hydroxypropyl acrylate, 1H,1H,3H-tetrafluoropropyl acrylate, 1H,1H,5H-octafluoropentyl acrylate, 1H,1H,7H-dodecafluoroheptyl acrylate, 1H,1H,9H-hexadecafluorononyl acrylate, 1H-1-(trifluoromethyl)trifluoroethyl acrylate, 1H,1H,3H-hexafluorobutyl acrylate, N,N-dimethylacrylamide, N,N-diethylacrylamide and N-acryloylmorpholine.

The methacrylic acid esters and derivatives thereof may be monofunctional methacrylates, or may be multifunctional methacrylates even though an amount to be used thereof is limited. Examples of the methacrylic acid esters and derivatives thereof include methyl methacrylate, ethyl methacrylate, n-propyl methacrylate, isopropyl methacrylate, n-butyl methacrylate, isobutyl methacrylate, sec-butyl methacrylate, hexyl methacrylate, octyl methacrylate, 2-ethylhexyl methacrylate, decyl methacrylate, isobornyl methacrylate, cyclohexyl methacrylate, phenyl methacrylate, benzyl methacrylate, 2-hydroxyethyl methacrylate, 2-hydroxypropyl methacrylate, 3-hydroxypropyl methacrylate, 2-hydroxybutyl methacrylate, 2-hydroxyphenylethyl methacrylate, ethylene glycol dimethacrylate, propylene glycol dimethacrylate, 1,4-butanediol dimethacrylate, diethylene glycol dimethacrylate, triethylene glycol dimethacrylate, trimethylolpropane dimethacrylate, trimethylolpropane trimethacrylate, pentaerythritol pentamethacrylate, 2,2,2-trifluoroethyl methacrylate, 2,2,3,3,3-pentafluoropropyl methacrylate, 2-(perfluorobutyl)ethyl methacrylate, 3-perfluorobutyl-2-hydroxypropyl methacrylate, 2-(perfluorohexyl)ethyl methacrylate, 3-perfluorohexyl-2-hydroxypropyl methacrylate, 2-(perfluorooctyl)ethyl methacrylate, 3-perfluorooctyl-2-hydroxypropyl methacrylate, 2-(perfluorodecyl)ethyl methacrylate, 2-(perfluoro-3-methylbutyl)ethyl methacrylate, 3-(perfluoro-3-methylbutyl)-2-hydroxypropyl methacrylate, 2-(perfluoro-5-methylhexyl)ethyl methacrylate, 2-(perfluoro-3-methylbutyl)-2-hydroxypropyl methacrylate, 3-(perfluoro-5-methylhexyl)-2-hydroxypropyl methacrylate, 2-(perfluoro-7-methyloctyl)ethyl-methacrylate, 3-(perfluoro-7-methyloctyl)-2-hydroxypropyl methacrylate, 1H,1H,3H-tetrafluoropropyl methacrylate, 1H,1H,5H-octafluoropentyl methacrylate, 1H,1H,7H-dodecafluoroheptyl methacrylate, 1H,1H,9H-hexadecafluorononyl methacrylate, 1H-1-(trifluoromethyl)trifluoroethyl-methacrylate, 1H,1H,3H-hexafluorobutyl methacrylate, N,N-dimethylmethacrylamide, N,N-diethylmethacrylamide and N-acryloylmorpholine.

Examples of styrene and derivatives thereof include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, o-hydroxystyrene, m-hydroxystyrene, p-hydroxystyrene, 2-vinylbiphenyl, 3-vinylbiphenyl, 4-vinylbiphenyl, 1-vinylnaphthalene, 2-vinylnaphthalene, 4-vinyl-p-terphenyl, 1-vinylanthracene, α-methylstyrene, o-isopropenyltoluene, m-isopropenyltoluene, p-isopropenyltoluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinylbiphenyl, diisopropylbenzene and 4-aminostyrene.

Examples of the vinyl esters of organic carboxylic acids and derivatives thereof include vinyl acetate, vinyl propionate, vinyl butyrate, vinyl benzoate and divinyl adipate.

Examples of the allylic esters of organic carboxylic acids and derivatives thereof include allyl acetate, allyl benzoate, diallyl adipate, diallyl terephthalate, diallyl isophthalate and diallyl phthalate.

Examples of the dialkyl esters of fumaric acid and derivatives thereof include dimethyl fumarate, diethyl fumarate, diisopropyl fumarate, di-sec-butyl fumarate, diisobutyl fumarate, di-n-butyl fumarate, di-2-ethylhexyl fumarate and dibenzyl fumarate.

Examples of the dialkyl esters of maleic acid and derivatives thereof include dimethyl maleate, diethyl maleate, diisopropyl maleate, di-sec-butyl maleate, diisobutyl maleate, di-n-butyl maleate, di-2-ethylhexyl maleate and dibenzyl maleate.

Examples of the dialkyl esters of itaconic acid and derivatives thereof include dimethyl itaconate, diethyl itaconate, diisopropyl itaconate, di-sec-butyl itaconate, di-isobutyl itaconate, di-n-butyl itaconate, di-2-ethylhexyl itaconate and dibenzyl itaconate.

Examples of the N-vinylamide derivatives of organic carboxylic acids include N-methyl-N-vinylacetamide.

Examples of the terminal unsaturated hydrocarbons and derivatives thereof include 1-butene, 1-pentene, 1-hexene, 1-octene, vinylcyclohexane, vinyl chloride and allyl alcohol.

Examples of the organic germanium derivatives containing an unsaturated hydrocarbon group include allyltrimethylgermanium, allyltriethylgermanium, allyltributylgermanium, trimethylvinylgermanium and triethylvinylgermanium.

Examples of the vinyl-1,3-dioxolan-2-on and derivatives thereof include 4-vinyl-1,3-dioxolan-2-on and 5-methyl-4-vinyl-1,3-dioxolan-2-on.

As the additional polymerizable monomer to be used, alkyl acrylate, alkyl methacrylate, styrene, 4-methoxystyrene, acrylonitrile, methacrylonitrile, allyltrimethylgermanium and 4-vinyl-1,3-dioxolan-2-on are preferred In the production of the polymer compound (E), the molar amount to be charged of the polymerizable monomer containing the first functional group is preferably 5% by mol or more and 50% by mol or less, and more preferably 5% by mol or more and 40% by mol or less with respect to all the polymerizable monomers which are involved in polymerization. By adjusting the molar amount to be charged of the polymerizable monomer containing the first functional group within this range, a cross-linked structure is adequately formed inside the insulating layer, the content of a polar group is maintained at a low level, and thus the polarization of the insulating layer is suppressed.

In the production of the polymer compound (E), the molar amount to be charged of the polymerizable monomer serving as a raw material of the repeating unit represented by the formula (2) is preferably 20% by mol or more and 70% by mol or less, and more preferably 30% by mol or more and 60% by mol or less with respect to all the polymerizable monomers which are involved in polymerization. If the molar amount to be charged of the polymerizable monomer serving as a raw material of the repeating unit represented by the formula (2) is less than 20% by mol, the solubility to an alkali solution is not sufficient and the development may not be carried out.

If the molar amount to be charged of the polymerizable monomer serving as a raw material of the repeating unit represented by the formula (2) is more than 70% by mol, the dissolution contrast reduces and the resolving property may be deteriorated.

The polymer compound (E) preferably has a weight average molecular weight of from 3000 to 1000000, and more preferably from 5000 to 500000 in terms of polystyrene. The polymer compound (E) may be linear, branched or cyclic.

Examples of the polymer compound (E) include poly (tertiary-butyl-4-vinyl benzoate-co-[2-[O-(1'-methylpropylideneamino)carboxyamino]ethyl-methacrylate]), poly((2-tetrahydropyranyl)-4-vinyl benzoate-co-[2-[O-(1-methylpropylideneamino)carboxyamino]ethyl-methacrylate]), poly((2-methyl 2-adamanthyl)-4-vinyl benzoate-co-[2-[O-(1'-methylpropylideneamino)carboxyamino]ethyl-methacrylate]), poly(tertiary-butyl-4-vinyl benzoate-co-acrylonitrile-co-[2-[O-(1'-methylpropylideneamino)carboxyamino]ethyl-methacrylate]), poly((2-tetrahydropyranyl)-4-vinyl benzoate-co-acrylonitrile-co-[2-[O-(1'-methylpropylideneamino)carboxyamino]ethyl-methacrylate]), poly((2-methyl 2-adamanthyl)-4-vinyl benzoate-co-acrylonitrile-co-[2-[O-(1'-methylpropylideneamino)carboxyamino]ethyl-methacrylate]), poly(tertiary-butyl-4-vinyl benzoate-co-4-methoxy-styrene-co-[2-[O-(1'-methylpropylideneamino)carboxyamino]ethyl-methacrylate]), poly((2-tetrahydropyranyl)-4-vinyl benzoate-co-4-methoxystyrene-co-[2-[O-(1'-methylpropylideneamino)carboxyamino]ethyl-methacrylate]), poly((2-methyl 2-adamanthyl)-4-vinyl benzoate-co-4-methoxystyrene-co-[2-[O-(1'-methylpropylideneamino)carboxyamino]ethyl-methacrylate]), poly(tertiarybutyl-4-vinyl benzoate-co-styrene-co-[2-[O-(1'-methylpropylideneamino)carboxyamino]ethyl-methacrylate]), poly((2-tetrahydropyranyl)-4-vinyl benzoate-co-styrene-co-[2-[O-(1'-methylpropylideneamino)carboxyamino]ethyl-methacrylate]), poly((2-methyl-2-adamanthyl)-4-vinyl benzoate-co-styrene-co-[2-[O-(1'-methylpropylideneamino) carboxyamino]ethyl-methacrylate]), poly(tertiary-butyl-4-vinyl benzoate-co-2,3,4,5,6-pentafluorostyrene-co-[2-[O-(1'-methylpropylideneamino)carboxyamino]ethyl-methacrylate]), poly((2-tetrahydropyranyl)-4-vinyl benzoate-co-4-2,3,4,5,6-pentafluorostyrene-co-[2-[O-(1'-methylpropylideneamino)carboxyamino]ethyl-methacrylate]), poly((1-methyladamanthyl)-4-vinyl benzoate-co-4-2,3,4,5,6-pentafluorostyrene-co-[2-[O-(1'-methylpropylideneamino)carboxyamino]ethyl-methacrylate]), poly(tertiary-butyl-4-vinyl benzoate-co-2,3,4,5,6-pentafluorostyrene-co-4-methoxystyrene-co-[2-[O-(1'-methylpropylideneamino)carboxyamino]ethyl-methacrylate]), poly((2-tetrahydropyranyl)-4-vinyl benzoate-co-4-2,3,4,5,6-pentafluorostyrene-co-4-methoxystyrene-co-[2-[O-(1'-methylpropylideneamino)carboxyamino]ethyl-methacrylate]), poly((2-methyl 2-adamanthyl)-4-vinyl benzoate-co-4-2,3,4,5,6-pentafluorostyrene-co-4-methoxystyrene-co-[2-[O-(1'-methylpropylideneamino)carboxyamino]ethyl-methacrylate]), poly(tertiary-butyl-4-vinyl benzoate-co-[2-[1'-(3',5'-dimethylpyrazolyl)carbonylamino]ethyl-methacrylate]), poly((2-tetrahydropyranyl)-4-vinyl benzoate-co-[2-[O-(1'-methylpropylideneamino)carboxyamino]ethyl-methacrylate]), poly((2-methyl 2-adamanthyl)-4-vinyl benzoate-co-[2-[1'-(3',5'-dimethylpyrazolyl)carbonylamino]ethyl-methacrylate]), poly(tertiary-butyl-4-vinyl benzoate-co-acrylonitrile-co-[2-[1'-(3',5'-dimethylpyrazolyl)carbonylamino]ethyl-methacrylate]), poly((2-tetrahydropyranyl)-4-vinyl benzoate-co-acrylonitrile-co-[2-[1'-(3',5'-dimethylpyrazolyl)carbonylamino]ethyl-methacrylate]), poly((2-methyl-2-adamanthyl)-4-vinyl benzoate-co-acrylonitrile-co-[2-[1'-(3',5'-dimethylpyrazolyl)carbonylamino]ethyl-methacrylate]), poly(tertiary-butyl-4-vinyl benzoate-co-4-methoxystyrene-co-[2-[1'-(3',5'-dimethylpyrazolyl)carbonylamino]ethyl-methacrylate]), poly((2-tetrahydropyranyl)-4-vinyl benzoate-co-4-methoxy-styrene-co-[2-[1'-(3',5'-dimethylpyrazolyl)carbonylamino]ethyl-methacrylate]), poly((2-methyl-2-adamanthyl)-4-vinyl benzoate-co-4-methoxystyrene-co-[2-[1'-(3',5'-dimethylpyrazolyl)carbonylamino]ethyl-methacrylate]), poly(tertiary-butyl-4-vinyl benzoate-co-styrene-co-[2-[1'-(3',5'-dimethylpyrazolyl)carbonylamino]ethyl-methacrylate]), poly((2-tetrahydropyranyl)-4-vinyl benzoate-co-styrene-co-[2-[1'-(3',5'-dimethylpyrazolyl)carbonylamino]ethyl-methacrylate]), poly(2-methyl-2-adamanthyl)-4-vinyl benzoate-co-styrene-co-[2-[1'-(3',5'-dimethylpyrazolyl)carbonylamino]ethyl-methacrylate]), poly(tertiary-butyl-4-vinyl benzoate-co-2,3,4,5,6-pentafluorostyrene-co-[2-[1'-(3',5'-dimethylpyrazolyl)carbonylamino]ethyl-methacrylate]), poly((2-tetrahydropyranyl)-4-vinyl benzoate-co-4-2,3,4,5,6-pentafluorostyrene-co-[2-[1'-(3',5'-dimethylpyrazolyl)carbonylamino]ethyl-methacrylate]), poly(2-methyl-2-adamanthyl)-4-vinyl benzoate-co-4-2,3,4,5,6-pentafluorostyrene-co-[2-[1'-(3',5'-dimethylpyrazolyl)carbonylamino]ethyl-methacrylate]), poly (tertiary-butyl-4-vinyl benzoate-co-2,3,4,5,6-pentafluorostyrene-co-4-methoxy styrene-co-[2-[1'-(3',5'-dimethylpyrazolyl)carbonylamino]ethyl-methacrylate]), poly((2-tetrahydropyranyl)-4-vinyl benzoate-co-4-2,3,4,5,6-pentafluorostyrene-co-4-methoxystyrene-co-[2-[1'-(3',5' dimethylpyrazolyl)carbonylamino]ethyl-methacrylate]), and poly((1-methyladamanthyl)-4-vinyl benzoate-co-4-2,3,4,5,6-pentafluorostyrene-co-4-methoxystyrene-co-[2-[1'-(3',5'-dimethylpyrazolyl)carbonylamino]ethyl-methacrylate]).

Examples of the polymer compound (E-1) include poly (tertiary-butyl-4-vinyl benzoate-co-4-(1-ethoxyethoxy)styrene-co-[2-[O-(1'-methylpropylideneamino)carboxyamino]ethyl-methacrylate]), poly((2-tetrahydropyranyl)-4-vinyl benzoate-co-4-(1-ethoxyethoxy)styrene-co-[2-[O-(1'-methylpropylideneamino)carboxyamino]ethyl-methacrylate]), poly((2-methyl-2-adamanthyl)-4-vinyl benzoate-co-4-(1-ethoxyethoxy)styrene-co-[2-[O-(1'-methylpropylideneamino)carboxyamino]ethyl-methacrylate]), poly(tertiary-butyl-4-vinyl benzoate-co-4-(1-ethoxyethoxy)styrene-co-acrylonitrile-co-[2-[O-(1'-methylpropylideneamino)carboxyamino]ethyl-methacrylate]), poly((2-tetrahydropyranyl)-4-vinyl benzoate-co-4-(1-ethoxyethoxy)styrene-co-acrylonitrile-co-[2-[O-(1'-methylpropylideneamino)carboxyamino]ethyl-methacrylate]), poly((2-methyl 2-adamanthyl)-4-vinyl benzoate-co-4-(1-ethoxyethoxy)styrene-co-acrylonitrile-co-[2-[O-(1'-methylpropylideneamino)carboxyamino]ethyl-methacrylate]), poly(tertiary-butyl-4-vinyl benzoate-co-4-(1-ethoxyethoxy)styrene-co-4-methoxystyrene-co-[2-[O-(1'-methylpropylideneamino)carboxyamino]ethyl-methacrylate]), poly((2-tetrahydropyranyl)-4-vinyl benzoate-co-4-(1-ethoxyethoxy)styrene-co-4-methoxystyrene-co-[2-[O-(1'-methylpropylideneamino)carboxyamino]ethyl-methacrylate]), poly((2-methyl 2-adamanthyl)-4-vinyl benzoate-co-4-(1-ethoxyethoxy)styrene-co-4-methoxystyrene-co-[2-[O-(1'-methylpropylideneamino)carboxyamino]ethyl-methacrylate]), poly(tertiary-butyl-4-vinyl benzoate-co-4-(1-ethoxyethoxy)styrene-co-styrene-co-[2-[O-(1'-methylpropylideneamino)carboxyamino]ethyl-methacrylate]), poly((2-tetrahydropyranyl)-4-vinyl benzoate-co-4-(1-ethoxyethoxy)styrene-co-styrene-co-[2-[O-(1'-methylpropylideneamino)carboxyamino]ethyl-methacrylate]), poly((1-methyladamanthyl)-4-vinyl benzoate-co-4-(1-ethoxyethoxy)styrene-co-styrene-co-[2-[O-(1'-methylpropylideneamino)carboxyamino]ethyl-methacrylate]), poly(tertiary-butyl-4-vinyl benzoate-co-4-(1-ethoxyethoxy)styrene-co-[2-[1'-(3',5'-dimethylpyrazolyl)carbonylamino]ethyl-methacrylate]), poly((2-tetrahydropyranyl)-4-vinyl benzoate-co-4-(1-ethoxyethoxy)styrene-co-[2-[O-(1'-methylpropylideneamino)carboxyamino]ethyl-methacrylate]), poly((2-methyl-2-adamanthyl)-4-vinyl benzoate-co-4-(1-ethoxyethoxy)styrene-co-[2-[1'-(3',5'-dimethlypyrazolyl)carbonylamino]ethyl-methacrylate]), poly(tertiary-butyl-4-vinyl benzoate-co-4-(1-ethoxyethoxy)styrene-co-acrylonitrile-co-[2-[1'-(3',5'-dimethylpyrazolyl)carbonylamino]ethyl-methacrylate]), poly((2-tetrahydropyranyl)-4-vinyl benzoate-co-4-(1-ethoxyethoxy)styrene-co-acrylonitrile-co-[2-[1'-(3',5'-dimethylpyrazolyl)carbonylamino]ethyl-methacrylate]), poly((2-methyl-2-adamanthyl)-4-vinyl benzoate-co-styrene-co-4-(1-ethoxyethoxy)styrene-co-acrylonitrile-co-[2-[1'-(3',5'-dimethylpyrazolyl)carbonylamino]ethyl-methacrylate]), poly(tertiary-butyl-4-vinyl benzoate-co-4-(1-ethoxyethoxy)styrene-co-4-methoxystyrene-co-[2-[1'-(3',5'-dimethylpyrazolyl)carbonylamino]ethyl-methacrylate]), poly((2-tetrahydropyranyl)-4-vinyl benzoate-co-4-(1-ethoxyethoxy)styrene-co-4-methoxystyrene-co-[2-[1'-(3',5'-dimethylpyrazolyl)carbonylamino]ethyl-methacrylate]), poly((1-methyladamanthyl)-4-vinyl benzoate-co-4-(1-ethoxyethoxy)styrene-co-4-methoxystyrene-co-[2-[1'-(3',5'-dimethylpyrazolyl)carbonylamino]ethyl-methacrylate]), poly(tertiary-butyl-4-vinyl benzoate-co-4-(1-ethoxyethoxy)styrene-co-styrene-co-[2-[1'-(3',5'-dimethylpyrazolyl)carbonylamino]ethyl-methacrylate]), poly((2-tetrahydropyranyl)-4-vinyl benzoate-co-4-(1-ethoxyethoxy)styrene-co-styrene-co-[2-[1'-(3',5'-dimethylpyrazolyl)carbonylamino]ethyl-methacrylate]), poly((2-methyl-2-adamanthyl)-4-vinyl benzoate-co-4-(1-ethoxyethoxy)styrene-co-styrene-co-[2-[1'-(3',5'-dimethylpyrazolyl)carbonylamino]ethyl-methacrylate]), poly(tertiary-butyl 4-vinyl benzoate-co-4-(1-ethoxyethoxy)styrene-co-2,3,4,5,6-pentafluorostyrene-co-[2-[O-

(1'-methylpropylideneamino)carboxyamino]ethyl-methacrylate]), poly((2-tetrahydropyranyl)-4-vinyl benzoate-co-4-(1-ethoxyethoxy)styrene-co-4-2,3,4,5,6-pentafluorostyrene-co-[2-[O-(1'-methylpropylideneamino)carboxyamino]ethyl-methacrylate]), poly((2-methyl adamanthyl)-4-vinyl benzoate-co-4-(1-ethoxyethoxy)styrene-co-4-2,3,4,5,6-pentafluorostyrene-co-[2-[O-(1'-methylpropylideneamino)carboxyamino]ethyl-methacrylate]), poly(tertiary-butyl-4-vinyl benzoate-co-4-(1-ethoxyethoxy)styrene-co-2,3,4,5,6-pentafluorostyrene-co-4-methoxystyrene-co-[2-[O-(1'-methylpropylideneamino)carboxyamino]ethyl-methacrylate]), poly((2-tetrahydropyranyl)-4-vinyl benzoate-co-4-(1-ethoxyethoxy)styrene-co-4-2,3,4,5,6-pentafluorostyrene-co-4-methoxystyrene-co-[2-[O-(1'-methylpropylideneamino)carboxyamino]ethyl-methacrylate]), poly((2-methyl 2-adamanthyl)-4-vinyl benzoate-co-4-(1-ethoxyethoxy)styrene-co-4-2,3,4,5,6-pentafluorostyrene-co-4-methoxystyrene-co-[2-[O-(1'-methylpropylideneamino)carboxyamino]ethyl-methacrylate]), poly(tertiary-butyl-4-vinyl benzoate-co-4-(1-ethoxyethoxy)styrene-co-2,3,4,5,6-pentafluorostyrene-co-[2-[1'-(3',5'-dimethylpyrazolyl)carbonylamino]ethyl-methacrylate]), poly((2-tetrahydropyranyl)-4-vinyl benzoate-co-4-(1-ethoxyethoxy)styrene-co-4-2,3,4,5,6-pentafluorostyrene-co-[2-[1'-(3',5'-dimethylpyrazolyl)carbonylamino]ethyl-methacrylate]), poly((2-methyl-2-adamanthyl)-4-vinyl benzoate-co-4-(1-ethoxyethoxy)styrene-co-4-2,3,4,5,6-pentafluorostyrene-co-[2-[1'-(3',5'-dimethylpyrazolyl)carbonylamino]ethyl-methacrylate]), poly(tertiary-butyl-4-vinyl benzoate-co-4-(1-ethoxyethoxy)styrene-co-2,3,4,5,6-pentafluorostyrene-co-4-methoxystyrene-co-[2-[1'-(3',5'-dimethylpyrazolyl)carbonylamino]ethyl-methacrylate]), poly((2-tetrahydropyranyl)-4-vinyl benzoate-co-4-(1-ethoxyethoxy)styrene-co-4-2,3,4,5,6-pentafluorostyrene-co-4-methoxystyrene-co-[2-[1'-(3',5'-dimethylpyrazolyl)carbonylamino]ethyl-methacrylate]), and poly((2-methyl 2-adamanthyl)-4-vinyl benzoate-co-4-(1-ethoxyethoxy)styrene-co-4-2,3,4,5,6-pentafluorostyrene-co-4-methoxystyrene-co-[2-[1'-(3',5'-dimethylpyrazolyl) carbonylamino]ethyl-methacrylate]).

Compound (F)

The above-mentioned positive photosensitive resin material (A-1) contains a compound (F) which is a compound capable of affording an acid by irradiating electromagnetic waves or an electron beam and has a pyrolysis temperature of 200° C. or lower. Pyrolysis as used herein means generating an acid by heating.

Generally, electromagnetic waves include infrared light, visible light, ultraviolet light, and the like. Preferred electromagnetic waves are ultraviolet light. More preferred electromagnetic waves are ultraviolet light having a wavelength of 450 nm or less, preferably 200 to 410 nm. If the wavelength of ultraviolet light is too short, electromagnetic waves may not arrive to the interface between a substrate and an insulating layer. If the wavelength of ultraviolet light is too long, a compound (F) may not decompose and development may not be carried out.

The pyrolysis temperature of the compound is 200° C. or lower, preferably 100 to 200° C., more preferably 120 to 200° C. If the pyrolysis temperature of the compound is higher than 200° C., the cross-linked structure may be insufficiently formed.

Examples of the compound (F) include a toluenesulfonic acid ester compound and a triazine compound.

Examples of the toluenesulfonic acid ester compound include α-(p-toluenesulfonyloxymethyl)benzoin, α-(p-toluenesulfonyloxy)-o-nitrotoluene, and α-(p-toluenesulfonyloxy)-p-nitrotoluene.

Examples of the triazine compound include 2,4-bis(trichloromethyl)-6-methyl-1,3,5-triazine, 2,4,6-tris(trichloromethyl)-1,3,5-triazine, 2,4-bis(trichloromethyl)-6-phenyl-1,3,5-triazine, 2,4-bis(trichloromethyl)-6-(4'-methoxyphenyl)-1,3,5-triazine and 2,4-bis(trichloromethyl)-6-(3',4'-dimethoxyphenyl)-1,3,5-triazine.

The above-mentioned positive photosensitive resin material (A-1) may further contain a compound capable of affording an acid by irradiating electromagnetic waves or an electron beam and having a pyrolysis temperature of 200° C. or higher and a thermal acid generator having a pyrolysis temperature of 200° C. or lower in addition to the compound (F). It is sufficient that the function to generate acid by irradiation of electromagnetic waves or an electron beam and the function to afford an acid when heating to a predetermined temperature, for example, 100° C. or higher, are comprised in an insulating layer material, and one kind of compound does not necessarily comprise the functions.

The amount of the compound (F) contained in the first insulating layer material is 0.1% by weight to 20% by weight, preferably 0.5% by weight to 10% by weight, more preferably 1% by weight to 5% by weight with respect to the photosensitive resin material (A). If the amount of the compound (F) is less than 0.1% by weight, the resolution of the first insulating layer material may decrease. If the amount of the compound (F) is more than 20% by weight, the preservation stability may deteriorate.

A negative photosensitive resin material (A-2) contains a polymer compound (G) containing a repeating unit having a cyclic ether structure and a repeating unit represented by the formula (7) and a compound (H) capable of affording an acid by irradiating electromagnetic waves or an electron beam.

Polymer Compound (G)

A compound containing a cyclic ether structure is cationically polymerized in the presence of an acid. Therefore, the polymer compound (G) may form a cross-linked structure. If an acid generator which affords an acid by the action of light or heat and a cationic polymerization initiator which affords a cationic species by the action of light or heat are used to cationically polymerize a polymer compound (G), the polymerization is promoted by energy such as light and heat and the crosslink density of a gate insulating layer formed by using the polymer compound (G) particularly increases.

If a cross-linked structure is formed inside the gate insulating layer, the movement of the molecular structure is inhibited, and thus the polarization of the gate insulating layer is inhibited. If the polarization of the gate insulating layer is suppressed, hysteresis of the organic thin film transistor is lowered and the operation accuracy of the organic thin film transistor is improved.

In the formula (7), $R^{14}$ represents a hydrogen atom or a methyl group. In one embodiment, $R^{14}$ is a hydrogen atom.

In the formula (7), $R^E$ represents a linking moiety which links the main chain with a side chain and optionally has a fluorine atom. The definition and specific examples of the linking moiety represented by $R^E$ are the same as the definition and specific examples of the linking moiety represented by $R^B$. t1 represents an integer of 0 or 1. In one embodiment, t1 is 0.

In the formula (7), $R^{16}$ represents a hydrogen atom or a monovalent organic group having from 1 to 20 carbon atoms. A hydrogen atom in the monovalent organic group having from 1 to 20 carbon atoms may have been substituted with a fluorine atom.

The definition and the specific examples of the monovalent organic group having from 1 to 20 carbon atoms represented by $R^{16}$ are the same as the definition and the specific examples of the above-mentioned monovalent organic group having from 1 to 20 carbon atoms represented by $R^4$.

In the formula (7), $R^{15}$ represents an organic group capable of being detached by an acid. The organic group capable of being detached by an acid represented by $R^{15}$ is an organic group which is detached by the action of an acid to produce a phenolic hydroxyl group. The phenolic hydroxyl group can react with the cyclic ether structure to form a cross-linked structure. A phenolic hydroxyl group is able to terminate cation polymerization of the polymer compound (G) or to reduce the reaction rate of the cation polymerization due to chain transfer, and may suppress the polymer compound (G) to excessively progress in cation polymerization in the presence of an acid.

Examples of the organic group capable of being detached by an acid include alkoxyalkyl groups having from 2 to 20 carbon atoms and optionally having a substituent, groups having from 3 to 20 carbon atoms and having a cyclic hydrocarbon structure, tertiary alkyl groups, a tetrahydrofuranyl group optionally having been substituted, and a tetrahydropyranyl group optionally having been substituted.

The definition and specific examples of alkoxyalkyl groups, which is represented by $R^{15}$, having from 2 to 20 carbon atoms and optionally having a substituent, groups having from 3 to 20 carbon atoms and having a cyclic hydrocarbon structure, a tetrahydrofuranyl group optionally having a substituent and a tetrahydropyranyl group optionally having a substituent are the same as the definition and specific examples of alkoxyalkyl groups, which is represented by $R^{11}$, having from 2 to 20 carbon atoms and optionally having a substituent, groups having from 3 to 20 carbon atoms and having a cyclic hydrocarbon structure, a tetrahydrofuranyl group optionally having a substituent and a tetrahydropyranyl group optionally having a substituent.

Examples of the tertiary alkyl groups represented by $R^{15}$ include tertiary-butyl groups.

In the formula (7), t2 represents an integer of 1 to 5. In one embodiment, t2 is 1.

As the repeating unit containing a cyclic ether structure, a repeating unit represented by the formula (8) or a repeating unit represented by the formula (9) is preferred.

In the formula (8), $R^{17}$ represents a hydrogen atom or a methyl group. In one embodiment, $R^{17}$ is a methyl group.

In the formula (8), $R^{18}$, $R^{19}$ and $R^{20}$ each independently represent a hydrogen atom or a monovalent organic group having from 1 to 20 carbon atoms. A hydrogen atom in the monovalent organic group having from 1 to 20 carbon atoms may have been substituted with a fluorine atom. The definition and specific examples of the monovalent organic groups, represented by $R^{18}$, $R^{19}$, $R^{20}$ having from 1 to 20 carbon atoms, are the same as the definition and specific examples of the monovalent organic groups, represented by the above-mentioned $R^4$ and having from 1 to 20 carbon atoms.

In the formula (8), $R^G$ represents a linking moiety which links the main chain with a side chain and optionally has a fluorine atom. The definition and specific examples of the linking moiety represented by $R^G$ are the same as the definition and specific examples of the linking moiety represented by $R^B$. The suffix u represents an integer of 0 or 1. In one embodiment, u is 1 and $R^G$ is a bond represented by —COO—.

In the formula (9), $R^{21}$ represents a hydrogen atom or a methyl group. In one embodiment, $R^{21}$ is a methyl group.

In the formula (9), $R^{22}$, $R^{23}$, $R^{24}$, $R^{25}$ and $R^{26}$ each independently represent a hydrogen atom or a monovalent organic group having from 1 to 20 carbon atoms. A hydrogen atom in the monovalent organic group having from 1 to 20 carbon atoms may have been substituted with a fluorine atom. The definition and specific examples of the monovalent organic groups, represented by $R^{22}$, $R^{23}$, $R^{24}$, $R^{25}$ and $R^{26}$ and having from 1 to 20 carbon atoms, are the same as the definition and specific examples of the monovalent organic groups, represented by the above-mentioned $R^4$ and having from 1 to 20 carbon atoms.

In the formula (9), $R^H$ represents a linking moiety which links the main chain with a side chain and optionally has a fluorine atom. The definition and specific examples of the linking moiety represented by $R^H$ are the same as the definition and specific examples of the linking moiety represented by $R^B$. v represents an integer of 0 or 1. In one embodiment, v is 1 and $R^H$ is a bond represented by —COO—.

One aspect of the polymer compound (G) is a polymer compound (G-1) containing at least one repeating unit selected from the group consisting of repeating units containing the first functional group in addition to a repeating unit represented by the formula (7) and a repeating unit represented by the formula (8) or a repeating unit represented by the formula (9).

The first functional group does not react with active hydrogen. However, when the first functional group is subjected to the action of electromagnetic wave or heat, the second functional group is produced and reacts with active hydrogen. That is, the first functional group is deprotected by the action of electromagnetic waves or heat and may afford the second functional group reactive with active hydrogen. The second functional group is bound to an active hydrogen-containing group contained in the first insulating layer material so that it can form a cross-linked structure within the insulating layer. Further, the active hydrogen-containing group reacts with the second functional group so that the amount of the active hydrogen contained in the insulating layer reduces and the polarization of the insulating layer is suppressed.

Examples of the active hydrogen-containing group contained in the negative photosensitive resin material (A-2) include hydroxyl groups produced when a polymer compound (G-1) containing the cyclic ether structure is polymerized in the presence of an acid, and hydroxyl groups produced by that an organic group is detached from a repeating unit represented by the formula (7) by the action of an acid.

The negative photosensitive resin material (A-2) may further contain at least one active hydrogen compound selected from the group consisting of an active hydrogen compound which is a low-molecular compound containing two or more active hydrogen atoms and an active hydrogen compound which is a polymer compound containing two or more active hydrogen atoms.

The preferred examples of the first functional group contained in the polymer compound (G-1) are the same as the preferred examples of the first functional group contained in the above-mentioned polymer compound (E).

The polymer compound (G) or (G-1) may further contain a repeating unit represented by the formula (10):

[Chemical Formula 15]

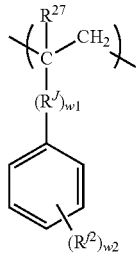
(10)

In the formula (10), $R^{27}$ represents a hydrogen atom or a methyl group.

In one embodiment, $R^{27}$ is a hydrogen atom.

In the formula (10), $R^J$ represents a linking moiety which links the main chain with a side chain and optionally has a fluorine atom. The definition and specific examples of the linking moiety represented by $R^J$ are the same as the definition and specific examples of the linking moiety represented by $R^B$. w1 represents an integer of 0 or 1. In one embodiment, the suffix w1 is 0.

In the formula (10), $R^{f2}$ represents a fluorine atom or a monovalent organic group having from 1 to 20 carbon atoms and optionally having a fluorine atom. The definition and the specific examples of the monovalent organic group having from 1 to 20 carbon atoms and optionally containing a fluorine atom, represented by $R^{f2}$ are the same as the definition and the specific examples of the above-mentioned monovalent organic group having from 1 to 20 carbon atoms and optionally containing a fluorine atom, represented by $R^{f1}$. In one embodiment, $R^{f2}$ is a fluorine atom.

w2 represents an integer of 1 to 5. In one embodiment, w2 is 5.

In the formula (10), at least one $R^{f2}$ is a fluorine atom or a monovalent organic group having from 1 to 20 carbon atoms and having a fluorine atom. Preferably, w2 is 5, and five $R^{f2}$ are fluorine atoms, or monovalent organic groups having from 1 to 20 carbon atoms and having a fluorine atom.

The polymer compound (G) can be produced by, for example, a method of copolymerizing, by using a photopolymerization initiator or a thermal polymerization initiator, a polymerizable monomer mixture containing a polymerizable monomer serving as a raw material of a repeating unit represented by the formula (7), a polymerizable monomer serving as a raw material of a repeating unit represented by the formula (8) or a polymerizable monomer serving as a raw material of a repeating unit represented by the formula (9), and a polymerizable monomer serving as a raw material of a repeating unit represented by the formula (10) or a polymerizable monomer containing the first functional group.

The specific examples of the polymerization monomer serving as a raw material of the repeating unit represented by the above-mentioned formula (7) are the same as the specific examples of the polymerization monomer serving as a raw material of the repeating unit represented by the above-mentioned formula (5).

Examples of the polymerizable monomer serving as a raw material of the repeating unit represented by the formula (8) include glycidylacrylate, glycidymethacrylate, 2-glycidylethylacrylate and 2-glycidylethylmethacrylate.

Examples of the polymerizable monomer serving as a raw material of the repeating unit represented by the formula (9) include 3-acryloyloxymethyl-3-ethyloxetane and 3-methacryloyloxymethyl-3-ethyloxetane.

The specific examples of the polymerization monomer serving as a raw material of the repeating unit represented by the above-mentioned formula (10) are the same as the specific examples of the polymerization monomer serving as a raw material of the repeating unit represented by the formula (6).

The specific examples and the synthetic method of the polymerizable monomer containing the first functional group which may be used in the production of the polymer compound (G-1) are the same as the specific examples and the synthetic method of the polymerizable monomer containing the first functional group which may be used in the production of the polymer compound (E).

The polymer compound (G) may also be produced by adding to a polimerizable monomer mixture additional polymerizable monomers other than the polymerizable monomer serving as a raw material of a repeating unit represented by the formula (7), the polymerizable monomer serving as a raw material of a repeating unit represented by the formula (8), the polymerizable monomer serving as a raw material of a repeating unit represented by the formula (9), the polymerizable monomer serving as a raw material of the repeating unit represented by the formula (10) and the polymerizable monomer containing a first functional group.

Examples of the additional polymerizable monomers to be used in the production of the polymer compound (G) include acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group. The definition and the specific examples of the acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group are the same as the definition and the specific examples of the acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group, which may be additionally used in the production of the polymer compound (E).

The kind of the additional polymerizable monomer to be used in the production of the polymer compound (G) is appropriately selected depending on the property required of an insulating layer. From the viewpoint of excellent solvent resistance or reduced hysteresis of an organic thin film transistor, a monomer which forms a hard film having a high molecular density in a film containing a polymer compound obtained by the polymerization, such as styrene or styrene derivatives, is selected. Further, from the viewpoint of adhesiveness to a surface adjacent to the insulating layer, such as a surface of the gate electrode or the substrate or the like, a monomer, which imparts plasticity to the polymer compound (G), such as methacrylic acid esters and derivatives thereof, acrylic acid esters and derivatives thereof, is selected.

In the production of the polymer compound (G), the molar amount to be charged of the polymerizable monomer serving as a raw material of the repeating unit represented by the formula (7) is preferably 1% by mol or more and 70% by mol or less, and more preferably 5% by mol or more and 50% by mol or less with respect to all the polymerizable monomers which are involved in polymerization.

The sum of the molar amount to be charged of the polymerizable monomer serving as a raw material of a repeating unit represented by the formula (8) and the molar amount to be charged of the polymerizable monomer serving as a raw material of a repeating unit represented by the formula (9) is preferably 5% by mol or more and 70% by mol or less, and more preferably 10% by mol or more and 50% by mol or less with respect to all the polymerizable monomers which are involved in polymerization.

When the polymer compound (G-1) contains a repeating unit containing the first functional group, the molar amount to be charged of the polymerizable monomer containing the first functional group is preferably 5% by mol or more and 50% by mol or less, and more preferably 5% by mol or more and 40% by mol or less with respect to all the polymerizable monomers which are involved in polymerization. By adjusting the molar amount to be charged of the polymerizable monomer containing the first functional group within this range, a cross-linked structure is adequately formed inside the insulating layer, the content of a polar group is maintained at a low level, and thus the polarization of the insulating layer is suppressed.

The polymer compound (G) preferably has a weight average molecular weight of from 3000 to 1000000, and more preferably from 5000 to 500000 in terms of polystyrene. The polymer compound (G) may be linear, branched or cyclic.

Examples of the polymer compound (G) include poly(4-(2-ethoxyethoxy)styrene-co-glycidyl methacrylate), poly(4-(2-ethoxyethoxy)styrene-co-3-methacryloyloxymethyl-3-ethyloxetane), poly(4-(methoxymethoxy)styrene-co-glycidyl methacrylate), poly(4-(methoxymethoxy)styrene-co-3-methacryloyloxymethyl-3-ethyloxetane), poly(4-methoxyethoxymethoxy)styrene-co-glycidyl methacrylate), poly(4-(methoxyethoxymethoxy)styrene-co-3-methacryloyloxymethyl-3-ethyloxetane), poly(4-(tetrahydropyranyloxy)styrene-co-glycidyl methacrylate), poly(4-(tetrahydropyranyloxy)styrene-co-3-methacryloyloxymethyl-3-ethyloxetane), poly(4-(cyclopropylmethoxy)styrene-co-glycidyl methacrylate), poly(4-(cyclo propylmethoxy)styrene-co-3-methacryloyloxymethyl-3-ethyloxetane), poly(4-(cyclohexyloxy)styrene-co-glycidyl methacrylate), poly(4-cyclohexyloxy)styrene-co-3-methacryloyloxymethyl-3-ethyloxetane), poly(4-(2-ethoxyethoxy)styrene-co-glycidyl methacrylate-co-[2-[O-(1'-methylpropylideneamino)carboxyamino]ethyl-methacrylate]), poly(4-(2-ethoxyethoxy)styrene-co-3-methacryloyloxymethyl-3-ethyloxetane-co-[2-[O-(1'-methylpropylideneamino)carboxyamino]ethyl-methacrylate]), poly(4-methoxymethoxy)styrene-co-glycidyl methacrylate-co-[2-[O-(1'-methylpropylideneamino)carboxyamino]ethyl-methacrylate]), poly(4-(methoxymethoxy)styrene-co-3-methacryloyloxymethyl-3-ethyloxetane-co-[2-[O-(1'-methylpropylideneamino)carboxyamino]ethyl-methacrylate]), poly(4-(methoxyethoxymethoxy)styrene-co-glycidyl methacrylate-co-[2-[O-(1'-methylpropylideneamino)carboxyamino]ethyl-methacrylate]), poly(4-(methoxyethoxymethoxy)styrene-co-3-methacryloyloxymethyl-3-ethyloxetane-co-[2-[O-(1'-methylpropylideneamino)carboxyamino]ethyl-methacrylate]), poly(4-(tetrahydropyranyloxy)styrene-co-glycidyl methacrylate-co-[2-[O-(1'-methylpropylideneamino)carboxyamino]ethyl-methacrylate]), poly(4-(tetrahydropyranyloxy)styrene-co-3-methacryloyloxymethyl-3-ethyloxetane-co-2-[O-(1'-methylpropylideneamino)carboxyamino]ethyl-methacrylate]), poly(4-(cyclopropylmethoxy)styrene-co-glycidyl methacrylate-co-[2-[O-(1'-methylpropylideneamino)carboxyamino]ethyl-methacrylate]), poly(4-(cyclopropylmethoxy)styrene-co-3-methacryloyloxymethyl-3-ethyloxetane-co-[2-[O-(1'-methylpropylideneamino)carboxyamino]ethyl-methacrylate]), poly(4-(cyclohexyloxy)styrene-co-glycidyl methacrylate-co-[2-[O-(1'-methylpropylideneamino)carboxyamino]ethyl-methacrylate]), poly(4-(cyclohexyloxy)styrene-co-3-methacryloyloxymethyl-3-ethyloxetane-co-[2-[O-(1'-methylpropylideneamino)carboxyamino]ethyl-methacrylate]), poly(4-(2-ethoxyethoxy)styrene-co-glycidyl methacrylate-co-[2-[1'-(3',5'-dimethylpyrazolyl)carbonylamino]ethyl-methacrylate]), poly(4-(2-ethoxyethoxy)styrene-co-3-methacryloyloxymethyl-3-ethyloxetane-co-[2-[1'-(3',5'-dimethylpyrazolyl)carbonylamino]ethyl-methacrylate]), poly(4-(methoxymethoxy)styrene-co-glycidyl methacrylate-co-[2-[1'-(3',5'-dimethylpyrazolyl)carbonylamino]ethyl-methacrylate]), poly(4-(methoxymethoxy)styrene-co-3-methacryloyloxymethyl-3-ethyloxetane-co-[2-[1'-(3',5'-dimethylpyrazolyl)carbonylamino]ethyl-methacrylate]), poly(4-(methoxyethoxymethoxy)styrene-co-glycidyl methacrylate-co-[2-[1'-(3',5'-dimethylpyrazolyl)carbonylamino]ethyl-methacrylate]), poly(4-(methoxyethoxymethoxy)styrene-co-3-methacryloyloxymethyl-3-ethyloxetane-co-[2-[1'-(3',5'-dimethylpyrazolyl)carbonylamino]ethyl-methacrylate]), poly(4-(tetrahydropyranyloxy)styrene-co-glycidyl methacrylate-co-[2-[1'-(3',5'-dimethylpyrazolyl)carbonylamino]ethyl-methacrylate]), poly(4-(tetrahydropyranyloxy)styrene-co-3-methacryloyloxymethyl-3-ethyloxetane-co-[2-[1'-(3',5'-dimethylpyrazolyl)carbonylamino]ethyl-methacrylate]), poly(4-(cyclopropylmethoxy)styrene-co-glycidyl methacrylate-co-[2-[1'-(3',5'-dimethylpyrazolyl)carbonylamino]ethyl-methacrylate]), poly(4-(cyclopropylmethoxy)styrene-co-3-methacryloyloxymethyl-3-ethyloxetane-co-[2-[1'-(3',5'-dimethylpyrazolyl)carbonylamino]ethyl-methacrylate]), poly(4-(cyclohexyloxy)styrene-co-glycidyl methacrylateco-[2-[1'-(3',5'-dimethylpyrazolyl)carbonylamino]ethyl-methacrylate]), poly(4-(cyclohexyloxy)styrene-co-3-methacryloyloxymethyl-3-ethyloxetane-co-[2-[1'-(3',5'-dimethylpyrazolyl)carbonylamino]ethyl-methacrylate]), poly(4-(2-ethoxyethoxy)stylene-co-glycidyl methacrylate-co-pentafluorostyrene), poly(4-(2-ethoxyethoxy)styrene-co-3-methacryloyloxymethyl-3-ethyloxetane-co-pentafluorostyrene), poly(4-(methoxymethoxy)stylene-co-glycidyl methacrylate-co-pentafluorostyrene), poly(4-(methoxymethoxy)styrene-co-3-methacryloyloxymethyl-3-ethyloxetane-co-pentafluorostyrene), poly(4-methoxyethoxymethoxy)styrene-co-glycidyl methacrylate-co-pentafluorostyrene), poly(4-(methoxyethoxymethoxy)styrene-co-3-methacryloyloxymethyl-3-ethyloxetane-co-pentafluorostyrene), poly(4-(tetrahydropyranyloxy)styrene-co-glycidyl methacrylate-co-pentafluoro styrene), poly(4-(tetrahydropyranyloxy)styrene-co-3-methacryloyloxymethyl 3-ethyloxetane-co-pentafluorostyrene), poly(4-(cyclopropylmethoxy)styrene-co-glycidyl methacrylate-co-pentafluorostyrene), poly(4-(cyclopropylmethoxy) styrene-co-3-methacryloyloxymethyl-3-ethyloxetane-co-pentafluorostyrene), poly(4-(cyclohexyloxy)styrene-co-glycidyl methacrylate-co-pentafluorostyrene), poly(4-(cyclohexyloxy)styrene-co-3-methacryloyloxymethyl-3-ethyloxetane-co-pentafluorostyrene), poly(4-(2-ethoxyethoxy)styrene-co-glycidyl methacrylate-co-[2-[O-(1'-methylpropylideneamino)carboxyamino]ethyl-methacrylate]-co-acrylonitrile), poly(4-(2-ethoxyethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(methoxymethoxy)styrene-co-glycidyl methacrylate-co-[2-[O-(1'-methylpropilydeneamino)carboxyamino]ethyl-methacrylate]-co-acrylonitrile), poly(4-(methoxymethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(methoxyethoxymethoxy)styrene-co-glycidyl methacrylate-co-[2-[O-(1'-methylpropylideneamino)carboxyamino]ethyl-methacrylate]-co-acrylonitrile), poly(4-(methoxyethoxymethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(tetrahydropyranyloxy)styrene-co-glycidyl methacrylate-co-[2-[O-(1'-methylpropylideneamino)carboxyamino]ethyl-methacrylate]-co-acrylonitrile), poly(4-(tetrahydropyranyloxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(cyclopropylmethoxy)styrene-co-glycidyl methacrylate-co-[2-[O-(1'-methylpropylideneamino)carboxyamino]ethyl-methacrylate]-co-acrylonitrile), poly(4-cyclopropylmethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(cyclohexyloxy)styrene-co-glycidyl methacrylate-co-[2-[O-(1'-methylpropylideneamino)carboxyamino]ethyl-methacrylate]-co-acrylonitrile), and poly(4-(cyclohexyloxy)styrene-co-3-methacryloyloxymethyl-3-ethyloxetane-co-[2-[O-(1'-methylpropylideneamino)carboxyamino]ethyl-methacrylate]-co-acrylonitrile).

Compound (H)

The above-mentioned negative photosensitive resin material (A-2) contains a compound (H) capable of affording an acid by irradiating electromagnetic waves or an electron beam.

Examples of the compound (H) include a photo-acid generating agent and a photo cationic polymerization initiator. Examples of the photo-acid generating agent include toluenesulfonic acid ester compounds described as the compound (F).

It is preferred that the above-mentioned negative type photosensitive resin material (A-2) contains an photocationic polymerization initiator. Examples of the photo cationic polymerization initiator include an iodonium salt and a sulfonium salt.

Examples of the iodonium salt include diphenyliodonium hexafluorophosphate, diphenyliodonium hexafluoroantimonate, and trillcumyliodonium tetrakis(pentafluorophenyl)borate.

Examples of the sulfonium salt include triphenylsulfonium phosphate, p-(phenylthio)phenyldiphenylsulfonium hexafluorophosphate, triphenylsulfonium hexafluoroantimonate, p-(phenylthio)phenyldiphenyl sulfonium hexafluoroantimonate, 4,4'-bis[di(β-hydroxyethoxy)phenylsulfonio]phenylsulfide bis-hexafluoroantimonate, and 4-[4-(4-tert-butylbenzoyl)phenylthio]phenyl-di(4-methylphenyl)sulfonium hexafluorophosphate.

Specific examples of the photo cationic polymerization initiator include products commercially available under the trade name RHODRSIL 2074 (manufactured by Rhodia Japan, Inc.), the trade name Adeka Optomer SP-150 (manufactured by Adeka Corporation), the trade name Adeka Optomer SP-152 (manufactured by Adeka Corporation), the trade name Adeka Optomer SP-170 (manufactured by Adeka Corporation) and the trade name Adeka Optomer SP-172 (manufactured by Adeka Corporation). In addition to the above-mentioned photocationic polymerization initiator, the compounds described in JP 09-118663 A or JP 2007-262401 A may also be employed.

The amount of the compound (H) contained in the first insulating layer material is 0.1% by weight to 20% by weight, preferably 0.5% by weight to 10% by weight, more preferably 1% by weight to 5% by weight with respect to the photosensitive resin material (A). If the amount of the compound (H) is less than 0.1% by weight, the resolution of the first insulating layer material may decrease. If the amount of the compound (F) is more than 20% by weight, the preservation stability may deteriorate.

<Tungsten (V) Alkoxide (B)>

The first insulating layer material used in the present invention contains a tungsten (V) alkoxide (B). Examples of the tungsten (V) alkoxide (B) include tungsten (V) methoxide, tungsten (V) ethoxide, tungsten (V) isopropoxide and tungsten (V) butoxide.

The amount of the tungsten (V) alkoxide (B) in a first insulating layer material is preferably from 0.1 to 30% by weight, more preferably from 1 to 25% by weight, and further preferably from 5 to 20% by weight based on the weight of the photosensitive resin material (A). If the amount of the tungsten (V) alkoxide (B) is less than 0.1% by weight, the curing reaction of the second insulating layer material may not proceed. If the amount of the compound (F) is more than 30% by weight, the preservation stability may deteriorate.

<Basic Compound (C)>

The first insulating layer material used for the present invention may contain a basic compound (C). Examples of the basic compound (C) include amine compounds.

Examples of the amine compound include triethylamine, pyridine, diethylamine, ethanolamine, 1,8-diazabicyclo[5.4.0]undeca-7-en, 1,5-diazabicyclo[4.3.0]non-5-en.

The amount of the basic compound (C) contained in the first insulating layer material is preferably from 0.001 Eq to 5 Eq, more preferably from 0.005 Eq to 4 Eq and further preferably from 0.01 Eq to 3 Eq with respect to the tungsten (V) alkoxide (B). If the amount of the basic compound is less than 0.001 Eq, an unexposed part may dissolve at the time of development when the above-mentioned photosensitive resin material (A) is a positive photosensitive resin material (A-1), and an unexposed part may not dissolve at the time of development when the above-mentioned photosensitive resin material (A) is a negative photosensitive resin material (A-2). If the amount of the basic compound is more than 5 Eq, an exposed part may dissolve at the time of development when the above-mentioned photosensitive resin material (A) is a positive photosensitive resin material (A-1), and an exposed part may also dissolve at the time of development when the above-mentioned photosensitive resin material (A) is a negative photosensitive resin material (A-2).

(Second Insulating Layer Material)

<Polymer Compound (D)>

The second insulating layer material used for the present invention is a material which differs from the first insulating layer material. The second insulating layer material comprises a polymer compound (D), and the polymer compound (D) contains a repeating unit having a cyclic ether structure and a repeating unit containing an organic group capable of being detached by an acid and represented by the formula (1).

The cyclic ether structure produces a cation in the presence of an acid and is cationically polymerized. Further, in the presence of an acid, a hydroxyl group produced by that the organic group R capable of being detached by an acid in the repeating unit represented by the formula (1) is detached, reacts with the cyclic ether structure. Therefore, a cross-linking reaction of the polymer compound (D) occurs in the presence of an acid and thereby, a cross-linked structure may be formed.

The tungsten (V) alkoxide (B) contained in the first gate insulating layer produces a tungstic acid by hydrolysis.

A solution containing the first insulating layer material may be applied on a substrate under an atmosphere containing moisture, for example, under the air atmosphere and dried to produce a tungstic acid on the surface of the first gate insulating layer. A tungstic acid is excellent in heat resistance and chemical resistance, and the tungstic acid is able to exist in the surface of the first gate insulating layer even after an electrode formation process such as sputtering and etching is carried out.

Then, the crosslinking reaction of the polymer compound (D) contained in the second organic thin film transistor insulating material on the first gate insulating layer is promoted under the presence of the generated tungstic acid, and the second gate insulating layer is formed.

In the formula (1), $R^1$ represents a hydrogen atom or a methyl group. In one embodiment, $R^1$ is a hydrogen atom.

In the formula (1), $R^4$ represents a linking moiety which links the main chain with a side chain and optionally has a fluorine atom. The definition and specific examples of the linking moiety represented by $R^4$ are the same as the definition and specific examples of the linking moiety represented by $R^B$. p1 represents an integer of 0 or 1. In one embodiment, p1 is 0.

In the formula (1), R represents an organic group capable of being detached by an acid. The definition and specific examples of the organic group capable of being detached by an acid represented by R are the same as the definition and specific examples of the organic group capable of being detached by an acid represented by $R^{15}$.

R' represents a hydrogen atom or a monovalent organic group having from 1 to 20 carbon atoms. A hydrogen atom in the monovalent organic group having from 1 to 20 carbon atoms may have been substituted with a fluorine atom. The definition and the specific examples of the monovalent organic group having from 1 to 20 carbon atoms represented by R' are the same as the definition and the specific examples of the above-mentioned monovalent organic group having from 1 to 20 carbon atoms represented by $R^4$.

As the repeating unit containing a cyclic ether structure, a repeating unit represented by the formula (11) or a repeating unit represented by the formula (12) is preferred.

In the formula (11), $R^{28}$ represents a hydrogen atom or a methyl group. In one embodiment, $R^{28}$ is a methyl group.

In the formula (11), $R^{29}$, $R^{30}$ and $R^{31}$ each independently represent a hydrogen atom or a monovalent organic group having from 1 to 20 carbon atoms. A hydrogen atom in the monovalent organic group having from 1 to 20 carbon atoms may have been substituted with a fluorine atom. The definition and specific examples of the monovalent organic groups, represented by $R^{29}$, $R^{30}$, $R^{31}$ having from 1 to 20 carbon atoms, are the same as the definition and specific examples of the monovalent organic groups, represented by the above-mentioned $R^4$ and having from 1 to 20 carbon atoms.

In the formula (11), $R^K$ represents a linking moiety which links the main chain with a side chain and optionally has a fluorine atom. The definition and specific examples of the linking moiety represented by $R^K$ are the same as the definition and specific examples of the linking moiety represented by $R^B$. x represents an integer of 0 or 1. In one embodiment, x is 1 and $R^K$ is a bond represented by —COO—.

In the formula (12), $R^{32}$ represents a hydrogen atom or a methyl group. In one embodiment, $R^{32}$ is a methyl group.

In the formula (12), $R^{33}$, $R^{34}$, $R^{35}$, $R^{36}$ and $R^{37}$ each independently represent a hydrogen atom or a monovalent organic group having from 1 to 20 carbon atoms. A hydrogen atom in the monovalent organic group having from 1 to 20 carbon atoms may have been substituted with a fluorine atom. The definition and specific examples of the monovalent organic groups, represented by $R^{33}$, $R^{34}$, $R^{35}$, $R^{36}$ and $R^{37}$ and having from 1 to 20 carbon atoms, are the same as the definition and specific examples of the monovalent organic groups, represented by the above-mentioned $R^4$ and having from 1 to 20 carbon atoms.

In the formula (12), $R^L$ represents a linking moiety which links the main chain with a side chain and optionally has a fluorine atom. The definition and specific examples of the linking moiety represented by $R^L$ are the same as the definition and specific examples of the linking moiety represented by $R^B$. The y represents an integer of 0 or 1. In one embodiment, y is 1, and $R^L$ is a bond represented by —COO—.

One aspect of the polymer compound (D) is a polymer compound containing a repeating unit represented by the formula (1), and a repeating unit represented by the formula (11) or a repeating unit represented by the formula (12).

As the polymer compound (D), the polymer compound (D-1) containing at least one repeating unit selected from a repeating unit represented by the formula (13) and a repeating unit containing the first functional group is preferred.

In the formula (13), $R^{38}$ represents a hydrogen atom or a methyl group. In one embodiment, $R^{38}$ is a hydrogen atom.

In the formula (13), $R^M$ represents a linking moiety which links the main chain with a side chain and optionally has a fluorine atom. The definition and specific examples of the linking moiety represented by $R^M$ are the same as the definition and specific examples of the linking moiety represented by $R^B$. z1 represents an integer of 0 or 1. In one embodiment, z1 is 0.

In the formula (13), $R^{f3}$ represents a fluorine atom or a monovalent organic group having from 1 to 20 carbon atoms and optionally having a fluorine atom. The definition and the specific examples of the monovalent organic group having from 1 to 20 carbon atoms and optionally containing a fluorine atom, represented by $R^{f3}$ are the same as the definition and the specific examples of the above-mentioned monovalent organic group having from 1 to 20 carbon atoms and optionally containing a fluorine atom, represented by $R^{f1}$.

z2 represents an integer of 1 to 5. In one embodiment, z2 is 5.

In the formula (13), at least one $R^{f3}$ is a fluorine atom or a monovalent organic group having from 1 to 20 carbon atoms and having a fluorine atom. Preferably, z2 is 5, and five $R^{f3}$s are fluorine atoms, or monovalent organic groups having from 1 to 20 carbon atoms and having a fluorine atom.

The polymer compound (D) can be produced by, for example, a method of copolymerizing, by using a photopolymerization initiator or a thermal polymerization initiator, a polymerizable monomer mixture containing a polymerizable monomer serving as a raw material of the repeating unit represented by the formula (1), a polymerizable monomer serving as a raw material of the repeating unit represented by the formula (11) or a polymerizable monomer serving as a raw material of the repeating unit represented by the formula (12), and a polymerizable monomer serving as a raw material of the repeating unit represented by the formula (13) or a polymerizable monomer containing the first functional group.

The specific examples of the polymerization monomer serving as a raw material of the repeating unit represented by the above-mentioned formula (1) are the same as the specific examples of the polymerization monomer serving as a raw material of the repeating unit represented by the above-mentioned formula (7).

Examples of the polymerizable monomer serving as a raw material of the repeating unit represented by the formula (11) include glycidyl acrylate, glycidyl methacrylate, 2-glycidylethyl acrylate and 2-glycidylethyl methacrylate.

Examples of the polymerizable monomer serving as a raw material of the repeating unit represented by the formula (12) include 3-acryloyloxymethyl-3-ethyloxetane and 3-methacryloyloxymethyl-3-ethyloxetane.

The specific examples of the polymerization monomer serving as a raw material of the repeating unit represented by the above-mentioned formula (13) are the same as the specific examples of the polymerization monomer serving as a raw material of the repeating unit represented by the above-mentioned formula (6).

The specific examples and the synthetic method of the polymerizable monomer containing the first functional group which may be used in the production of the polymer compound (D-1) are the same as the specific examples and the synthetic method of the polymerizable monomer containing the first functional group which may be used in the production of the polymer compound (E).

The polymer compound (D) may also be produced by adding to a polimerizable monomer mixture additional polymerizable monomers other than the polymerizable monomer serving as a raw material of the repeating unit represented by the formula (1), the polymerizable monomer serving as a raw material of the repeating unit represented by the formula (11), the polymerizable monomer serving as a raw material of the repeating unit represented by the formula (12), the polymerizable monomer serving as a raw material of the repeating unit represented by the formula (13) and the polymerizable monomer containing the first functional group.

Examples of the additional polymerizable monomers to be used in the production of the polymer compound (D) include acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group. The definition and specific examples of the acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group are the same of those of the acrylic acid esters and derivatives thereof, methacrylic acid esters and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allylic esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group, which may be additionally used in the production of the polymer compound (E).

The kind of the additional polymerizable monomer to be used in the production of the polymer compound (D) is appropriately selected depending on the property required of an insulating layer. From the viewpoint of excellent solvent resistance or reduced hysteresis of an organic thin film transistor, a monomer such as styrene or styrene derivatives is selected since the monomer forms a hard film having a high molecular density as a film containing the polymer compound obtained by polymerization. Further, from the viewpoint of adhesiveness to a surface adjacent to the insulating layer, such as a surface of the gate electrode or the substrate or the like, a monomer such as methacrylic acid esters and derivatives thereof, acrylic acid esters and derivatives thereof is selected since the monomer imparts plasticity to the polymer compound (D).

In the production of the polymer compound (D), the molar amount to be charged of the polymerizable monomer serving as a raw material of the repeating unit represented by the formula (1) is preferably 1% by mol or more and 70% by mol or less, and more preferably 5% by mol or more and 50% by mol or less with respect to all the polymerizable monomers which are involved in polymerization.

The sum of the molar amount to be charged of the polymerizable monomer serving as a raw material of the repeating unit represented by the formula (11) and the molar amount to be charged of the polymerizable monomer serving as a raw material of the repeating unit represented by the formula (12) is preferably 5% by mol or more and 70% by mol or less, and more preferably 10% by mol or more and 50% by mol or less with respect to all the polymerizable monomers which are involved in polymerization.

When the polymer compound (D-1) contains the repeating unit containing the first functional group, the molar amount to be charged of the polymerizable monomer containing the first functional group is preferably 5% by mol or more and 50% by mol or less, and more preferably 5% by mol or more and 40% by mol or less with respect to all the polymerizable monomers which are involved in polymerization. By adjusting the molar amount to be charged of the polymerizable monomer containing the first functional group within this range, a cross-linked structure is adequately formed inside the insulating layer, the content of a polar group is maintained at a low level, and thus the polarization of the insulating layer is suppressed.

The polymer compound (D) preferably has a weight average molecular weight of from 3000 to 1000000, and more preferably from 5000 to 500000 in terms of polystyrene. The polymer compound (D) may be linear, branched or cyclic.

Examples of the polymer compound (D) include poly(4-(2-ethoxyethoxy)styrene-co-glycidyl methacrylate), poly(4-(2-ethoxyethoxy)styrene-co-3-methacryloyloxymethyl-3-ethyloxetane), poly(4-(methoxymethoxy)styrene-co-glycidyl methacrylate), poly(4-(methoxymethoxy)styrene-co-3-methacryloyloxymethyl-3-ethyloxetane), poly(4-methoxyethoxymethoxy)styrene-co-glycidyl methacrylate), poly(4-(methoxyethoxymethoxy)styrene-co-3-methacryloyloxymethyl-3-ethyloxetane), poly(4-(tetrahydropyranyloxy)styrene-co-glycidyl methacrylate), poly(4-(tetrahydropyranyloxy)styrene-co-3-methacryloyloxymethyl-3-ethyloxetane), poly(4-(cyclopropylmethoxy)styrene-co-glycidyl methacrylate), poly(4-(cyclopropylmethoxy)styrene-co-3-methacryloyloxymethyl-3-ethyloxetane), poly(4-(cyclohexyloxy)styrene-co-glycidyl methacrylate), poly(4-cyclohexyloxy)styrene-co-3-methacryloyloxymethyl-3-ethyloxetane), poly(4-(2-ethoxyethoxy)styrene-co-glycidyl methacrylate-co-[2-[O-(1'-methylpropylideneamino)carboxyamino]ethyl-methacrylate]), poly(4-(2-ethoxyethoxy)styrene-co-3-methacryloyloxymethyl-3-ethyloxetane-co-[2-[O-(1'-methylpropylideneamino)carboxyamino]ethyl-methacrylate]), poly(4-methoxymethoxy)styrene-co-glycidyl methacrylate-co-[2-[O-(1'-methylpropylideneamino)carboxyamino]ethyl-methacrylate]), poly(4-(methoxymethoxy)styrene-co-3-methacryloyloxymethyl-3-ethyloxetane-co-[2-[O-(1'-methylpropylideneamino)carboxyamino]ethyl-methacrylate]), poly(4-(methoxyethoxymethoxy)styrene-co-glycidyl methacrylate-co-[2-[O-(1'-methylpropylideneamino)carboxyamino]ethyl-methacrylate]), poly(4-(methoxyethoxymethoxy)styrene-co-3-methacryloyloxymethyl-3-ethyloxetane-co-[2-[O-(1'-methylpropylideneamino)carboxyamino]ethyl-methacrylate]), poly(4-(tetrahydropyranyloxy)styrene-co-glycidyl methacrylate-co-[2-[O-(1'-methylpropylideneamino)carboxyamino]ethyl-methacrylate]), poly(4-(tetrahydropyranyloxy)styrene-co-3-methacryloyloxymethyl-3-ethyloxetane-co-2-[O-(1'-methylpropylideneamino)carboxyamino]ethyl-methacrylate]), poly(4-(cyclopropylmethoxy)styrene-co-glycidyl methacrylate-co-[2-[O-(1'-methylpropylideneamino)carboxyamino]ethyl-methacrylate]), poly(4-(cyclopropylmethoxy)styrene-co-3-methacryloyloxymethyl-3-ethyloxetane-co-[2-[O-(1'-methylpropylideneamino)carboxyamino]ethyl-methacrylate]), poly(4-(cyclohexyloxy)styrene-co-glycidyl methacrylate-co-[2-[O-(1'-methylpropylideneamino)carboxyamino]ethyl-methacrylate]), poly(4-(cyclohexyloxy)styrene-co-3-methacryloyloxymethyl-3-ethyloxetane-co-[2-[O-(1'-methylpropylideneamino)carboxyamino]ethyl-methacrylate]), poly(4-(2-ethoxyethoxy)styrene-co-glycidyl methacrylate-co-[2-[1'(3',5'-dimethylpyrazolyl)carbonylamino]ethyl-methacrylate]), poly(4-(2-ethoxyethoxy)styrene-co-3-methacryloyloxymethyl-3-ethyloxetane-co-[2-[1'-(3',5'-dimethylpyrazolyl)carbonylamino]ethyl-methacrylate]), poly(4-(methoxymethoxy)styrene-co-glycidyl methacrylate-co-[2-[1'(3',5'-dimethylpyrazolyl)carbonylamino]ethyl-methacrylate]), poly(4-(methoxymethoxy)styrene-co-3-methacryloyloxymethyl-3-ethyloxetane-co-[2-[1'-(3',5'-dimethylpyrazolyl)carbonylamino]ethyl-methacrylate]), poly(4-(methoxyethoxymethoxy)styrene-co-glycidyl methacrylate-co-[2-[1'-(3',5'-dimethylpyrazolyl)carbonylamino]ethyl-methacrylate]), poly(4-(methoxyethoxymethoxy)styrene-co-3-methacryloyloxymethyl-3-ethyloxetane-co-[2-[1'-(3',5'-dimethylpyrazolyl)carbonylamino]ethyl-methacrylate]), poly(4-(tetrahydropyranyloxy)styrene-co-glycidyl methacrylate-co-[2-[1'-(3',5'-dimethylpyrazolyl)carbonylamino]ethyl-methacrylate]), poly(4-(tetrahydropyranyloxy)styrene-co-3-methacryloyloxymethyl-3-ethyloxetane-co-[2-[1'-(3',5'-dimethylpyrazolyl)carbonylamino]ethyl-methacrylate]), poly(4-(cyclopropylmethoxy)styrene-co-glycidyl methacrylate-co-[2-[1'(3',5'-dimethylpyrazolyl)carbonylamino]ethyl-methacrylate]), poly(4-(cyclopropylmethoxy)styrene-co-3-methacryloyloxymethyl-3-ethyloxetane-co-[2-[1'-(3',5'-dimethylpyrazolyl)carbonylamino]ethyl-methacrylate]), poly(4-(cyclohexyloxy)styrene-co-glycidyl methacrylate-co-[2-[1'-(3',5'-dimethylpyrazolyl)carbonylamino]ethyl-methacrylate]), poly(4-(cyclohexyloxy)styrene-co-3-methacryloyloxymethyl-3-ethyloxetane-co-[2-[1'-(3',5'-dimethylpyrazolyl)carbonylamino]ethyl-methacrylate]), poly(4-(2-ethoxyethoxy)stylene-co-glycidyl methacrylate-co-pentafluorostyrene), poly(4-(2-ethoxyethoxy)styrene-co-3-methacryloyloxymethyl-3-ethyloxetane-co-pentafluorostyrene), poly(4-(methoxymethoxy)stylene-co-glycidyl methacrylate-co-pentafluorostyrene), poly(4-(methoxymethoxy)styrene-co-3-methacryloyloxymethyl-3-ethyloxetane-co-pentafluorostyrene), poly(4-methoxyethoxymethoxy)styrene-co-glycidyl methacrylate-co-pentafluorostyrene), poly(4-(methoxyethoxymethoxy)styrene-co-3-methacryloyloxymethyl-3-ethyloxetane-co-pentafluorostyrene), poly(4-(tetrahydropyranyloxy)styrene-co-glycidyl methacrylate-co-pentafluorostyrene), poly(4-(tetrahydropyranyloxy)styrene-co-3- methacryloyloxymethyl-3-ethyloxetane-co-pentafluorostyrene), poly(4-(cyclopropylmethoxy)styrene-co-glycidyl methacrylate-co-pentafluorostyrene), poly(4-(cyclopropylmethoxy)styrene-co-3-methacryloyloxymethyl-3-ethyloxetane-co-pentafluorostyrene), poly(4-(cyclohexyloxy)styrene-co-glycidyl methacrylate-co-pentafluorostyrene), poly(4-(cyclohexyloxy)styrene-co-3-methacryloyloxymethyl-3-ethyloxetane-co-pentafluorostyrene), poly(4-(2-ethoxyethoxy)styrene-co-glycidyl methacrylate-co-[2-[O-(1'-methylpropylideneamino)carboxyamino]ethyl-methacrylate]-co-acrylonitrile), poly(4-(2-ethoxyethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(methoxymethoxy)styrene-co-glycidyl methacrylate-co-[2-[O-(1'-methylpropiydeneamino)carboxyamino]ethyl-methacrylate]-co-acrylonitrile), poly(4-(methoxymethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(methoxyethoxymethoxy)styrene-co-glycidyl methacrylate-co-[2-[O-(1'-methylpropylideneamino)carboxyamino]ethyl-methacrylate]-co-acrylonitrile), poly(4-(methoxyethoxymethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(tetrahydropyranyloxy)styrene-co-glycidyl methacrylate-co-[2-[O-(1'-methylpropylideneamino)carboxyamino]ethyl-methacrylate]-co-acrylonitrile), poly(4-(tetrahydropyranyloxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(cyclopropylmethoxy)styrene-co-glycidyl methacrylate-co-[2-[O-(1'-methylpropylideneamino)carboxyamino]ethyl-methacrylate]-co-acrylonitrile), poly(4-cyclopropylmethoxy)styrene-co-3-methacryloyloxymethyl-3-ethyloxetane-co-[2-[O-(1'-methylpropylideneamino)carboxyamino]ethyl-methacrylate]-co-acrylonitrile), poly(4-(cyclohexyloxy)styrene-co-glycidyl methacrylate-co-[2-[O-(1'-methylpropylideneamino)carboxyamino]ethyl-methacrylate]-co-acrylonitrile), and poly(4-(cyclohexyloxy)styrene-co-3-methacryloyloxymethyl-3-ethyloxetane-co-[2-[O-(1'-methylpropylideneamino)carboxyamino]ethyl-methacrylate]-co-acrylonitrile).

(First and Second Insulating Layer Materials)

The first insulating layer material used for the present invention may contain an additive agent for mixing or viscosity modification. Examples of the additive agent include a sensitizing agent, a leveling agent and a viscosity modifying agent.

The second insulating layer material used for the present invention may contain an optional component other than the polymer compound (D). However, the second insulating layer material does not contain a compound capable of affording an acid by irradiating electromagnetic waves or an electron beam or by the action of heat as the optional component, and may contain the compound which differs from a compound capable of affording an acid by irradiating electromagnetic waves or an electron beam or by the action of heat as the optional component. Examples of the optional component include an additive agent which do not afford an acid by irradiating electromagnetic waves or an electron beam or does not afford an acid by heating.

In the production of an organic thin film transistor, a first insulating layer coating solution obtained by adding an organic solvent to the first insulating layer material may also be used. The organic solvent is not particularly limited provided that the organic solvent dissolves the photosensitive resin material (A), the tungsten (V) alkoxide (B) and the basic compound (C). Examples of the organic solvent include ether solvents such as tetrahydrofuran and dibutyl ether, aliphatic hydrocarbon solvents such as hexane, cyclohexane and pentene, aromatic hydrocarbon solvents such as xylene, ketone solvents such as acetone, acetate solvents such as butyl acetate, alcohol solvents such as isopropyl alcohol, and halogen solvents such as chloroform. These organic solvents may be mixed and used. Among these organic solvents, an organic solvent having a boiling point of 100° C. to 200° C. under ambient pressure is preferred. Examples of the organic solvent having a boiling point of 100° C. to 200° C. under ambient pressure include 2-heptanone (boiling point 151° C.) and propylene glycol monomethyl ether acetate (boiling point 146° C.). A leveling agent, a surfactant and a curing catalyst may be added to the first insulating layer coating solution.

In the production of an organic thin film transistor, a second insulating layer coating solution obtained by adding an organic solvent to the second insulating layer material may also be used. The organic solvent is not particularly limited provided that the organic solvent dissolves the polymer compound (D). Examples of the organic solvent include ether solvents such as tetrahydrofuran and dibutyl ether, aliphatic hydrocarbon solvents such as hexane, cyclohexane and pentene, aromatic hydrocarbon solvents such as xylene, ketone solvents such as acetone, acetate solvents such as butyl acetate, alcohol solvents such as isopropyl alcohol, halogen solvents such as chloroform. These organic solvents may be mixed and used. Among these organic solvents, an organic solvent having a boiling point of 100° C. to 200° C. under ambient pressure is preferred. Examples of the organic solvent having a boiling point of 100° C. to 200° C. under ambient pressure include 2-heptanone (boiling point 151° C.) and propylene glycol monomethyl ether acetate (boiling point 146° C.). A leveling agent, a surfactant and a curing catalyst may be added to the insulating layer coating solution.

<Organic Thin Film Transistor>

FIG. 1 is a schematic cross-sectional view showing a structure of a bottom-gate/top-contact organic thin film transistor which is one embodiment of the present invention. This organic thin film transistor includes a substrate 1, a gate electrode 2 formed on the substrate 1, a first gate insulating layer 3a formed on the gate electrode 2, a second gate insulating layer 3b formed on the first gate insulating layer 3a, an organic semiconductor layer 4 formed on the second gate insulating layer 3b, a source electrode 5 and a drain electrode 6 formed on the organic semiconductor layer 4 with a channel portion sandwiched therebetween, and an overcoat 7 covering the whole body of the device.

The bottom-gate/top-contact organic thin film transistor can be produced by, for example, forming a gate electrode on a substrate, forming a first gate insulating layer on the gate electrode, forming a second gate insulating layer on the first gate insulating layer, forming an organic semiconductor layer on the second gate insulating layer, forming a source electrode and a drain electrode on the organic semiconductor layer, and forming an overcoat. The first insulating layer material is used for forming the first gate insulating layer, and the second insulating layer material is used for forming the second gate insulating layer.

Figure 2:
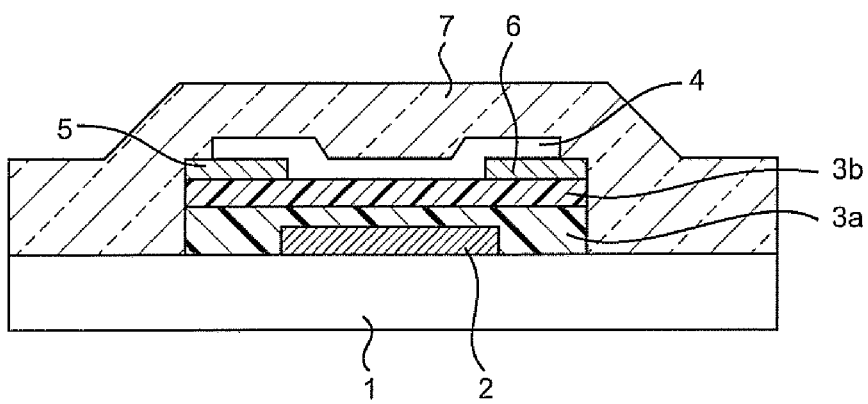
FIG. 2 a schematic cross-sectional view showing a structure of a bottom-gate/bottom-contact organic thin film transistor which is another embodiment of the present invention.

FIG. 2 is a schematic cross-sectional view showing a structure of a bottom-gate/bottom-contact organic thin film transistor which is one embodiment of the present invention. This organic thin film transistor includes a substrate 1, a gate electrode 2 formed on the substrate 1, a first gate insulating layer 3a formed on the gate electrode 2, a second gate insulating layer 3b formed on the first gate insulating layer 3a, a source electrode 5 and a drain electrode 6 formed on the second gate insulating layer 3b with a channel portion sandwiched therebetween, an organic semiconductor layer 4 formed on the source electrode 5 and the drain electrode 6, and an overcoat 7 covering the whole body of the device.

The bottom-gate/bottom-contact organic thin film transistor can be produced by, for example, forming a gate electrode on a substrate, forming a first gate insulating layer on the gate electrode, forming a second gate insulating layer on the first gate insulating layer, forming a source electrode and a drain electrode on the second gate insulating layer, forming an organic semiconductor layer on the source electrode and the drain electrode, and forming an overcoat. The first insulating layer material is used for forming the first gate insulating layer, and the second insulating layer material is used for forming the second gate insulating layer.

When a metal electrode included in an organic thin film transistor is produced by the sputtering process, and thus, an organic compound in an organic layer which contacts the metal steam may be deteriorated because a metal steam used for the sputtering process has high energy.

In the organic thin film transistor of the present invention, an electrode is, by first, produced on the first insulating layer formed from the first insulating layer material by the sputtering process, and then, the second insulating layer may be formed from the second insulating layer material. Thus, the second insulating layer may be formed without contacting the metal steam used for the sputtering process. Therefore, the rise in absolute value of threshold voltage by sputtering and the rise in hysteresis may be inhibited.

When a light emitting device such as an organic electroluminescence device (organic EL device) is driven by an organic thin film transistor, it is necessary to form a via hole in an insulating layer formed between an upper electrode and a lower gate electrode and to join the upper electrode and the lower gate electrode. In the conventional organic thin film transistor, a via hole have to be formed in the insulating layer formed from an organic thin film transistor material. Accordingly, the production process requires the steps of: applying a solution containing a resist material on the insulating layer to form a resist layer; exposing the resist layer through a mask; developing the resist layer to form a pattern of the resist layer; transferring the pattern to the insulating layer by using the resist layer in which the pattern was formed as a mask; and carrying out exfoliation removal of the resist layer in which the pattern was formed. Thus, the production process was complicated.

In the present invention, owing to the use of the first insulating layer material and the second insulating layer material, an organic thin film transistor having a via hole in a gate insulating layer may be produced by a simple production process.

<Formation Process of an Organic Thin Film Transistor Insulating Layer>

One embodiment of the formation process of an organic thin film transistor insulating layer of the present invention comprises the steps of:

applying a solution containing a first insulating layer material and a solvent to a substrate to form a first coated layer on the substrate (step S1);

irradiating a part of the first coated layer with electromagnetic waves or an electron beam (step S2).

removing the part of the first coated layer irradiated with electromagnetic waves or an electron beam to form a pattern in the first coated layer (step S3);

applying heat to the first coated layer in which the pattern is formed to form a first insulating layer (step S4);

forming a patterned electrode on the first insulating layer (step S5);

applying a solution containing a second insulating layer material and a solvent to the patterned electrode and the first insulating layer to form a second coated layer (step S6);

applying heat to the first insulating layer and the second coated layer (step S7); and removing the part of the second coated layer formed on the patterned electrode to form a second insulating layer (step S8).

The "substrate" as used herein refers to a constituent member of an organic thin film transistor on which the first insulating layer is disposed. As the organic thin film transistor insulating layer, a gate insulating layer is preferred.

For example, the formation of the first insulating layer is carried out as follows: a solution containing a first insulating layer material and an organic solvent (first insulating layer coating solution) is prepared; the first insulating layer coating solution is applied to a substrate to form a first coated layer; the first coated layer is dried. A part of the first coated layer is irradiated with electromagnetic waves or an electron beam through a mask, the first coated layer is treated with heat, and then, the irradiated part is removed with an alkali solution, and the unirradiated part is heated and cured.

In the step S1, the first insulating layer coating solution may be applied onto the substrate by a publicly known method, such as spin coating, die coating, screen printing, and inkjet. The drying of the first coated layer is optionally conducted. The drying as used herein means removing a solvent contained in the first coated layer.

Then, a part of the first coated layer is selectively irradiated with electromagnetic waves or an electron beam, for example, thorough a mask (step S2). The mask is a member having a transmitting part which transmits electromagnetic waves or an electron beam and a blocking part which blocks electromagnetic waves or an electron beam. The mask used herein has a blocking part, which blocks electromagnetic waves or an electron beam, having a shape corresponding to the part on which an insulating layer is formed within the surface of the substrate.

When the photosensitive resin material (A) is the positive photosensitive resin material (A-1), the compound (F) which produces an acid by irradiating electromagnetic waves or an electron beam is decomposed to produce an acid, an organic group $R^3$ which is capable of being detached by an acid in the positive photosensitive resin material (A-1) is detached, and an alkali soluble group (a group which gives the solubility to an alkali) is produced. The detaching reaction may be promoted by heating. Subsequently, the first coated layer selectively irradiated with electromagnetic waves or an electron beam through a mask is immersed in an alkali solution, the part irradiated with electromagnetic waves or an electron beam is dissolved and removed, and the pattern of the mask is transferred to the first coated layer (step S3).

The wavelength of the electromagnetic wave for irradiation is preferably 450 nm or less, more preferably from 150 to 410 nm. If the wavelength of the electromagnetic wave for irradiation is more than 450 nm, the decomposition of the compound (F) which produces an acid becomes insufficient, and the solubility to an alkali solution becomes insufficient. As a result, the pattern may not be formed. As the electromagnetic waves, ultraviolet light is preferred.

The irradiation with ultraviolet light may be carried out by using, for example, an exposure apparatus which is used for producing semiconductors or a LTV lamp which is used for curing LTV-curable resins. For example, ultraviolet light with a wavelength of 300 to 400 nm is used. The irradiation with an electron beam can be carried out by using, for example, an ultrasmall electron beam irradiation tube.

When the first coated layer is heated after the selective irradiation with electromagnetic waves or an electron beam through a mask, the heating have to be conducted in such a degree that the first functional group in the positive photosensitive resin material (A-1) is not deprotected. The temperature at which the first coated layer is heated is usually 60 to 150° C., preferably 80 to 130° C. The heating time is usually 15 seconds to 10 minutes, preferably 20 seconds to 5 minutes, and particularly 30 seconds to 1 minute is preferred. If the heating temperature is too low or the heating time is too short, the development may become insufficient. If the heating temperature is too high or the heating time is too long, the resolution may be deteriorated. The heating can be carried out by using a heater, oven and the like.

Since the first coated layer is not still cross-linked in the layer and is easy to dissolve, the fine pattern may be formed in high precision and within a short period. As the alkali solution, an alkali developing solution which is usually used to develop a positive resist may be used.

More specifically, the above-mentioned alkali solution is a solution obtained by dissolving an alkaline salt to an aqueous medium. The alkali solution has a pH of 10 or more, preferably a pH of 10 to 14, and more preferably a pH of 11 to 14.

The aqueous medium refers to water, or a solvent containing water and a water-soluble organic solvent. The water-soluble organic solvent includes acetone, methanol, ethanol, isopropanol and tetrahydrofuran. The content of the water-soluble organic solvent in the aqueous medium is 50% by weight or less, preferably 40% by weight or less, and more preferably 30% by weight or less.

As the alkaline salt, tetramethylammonium hydroxide (TMAH), monoethanolamine, sodium hydroxide, potassium hydrate and potassium carbonate are usually used.

Subsequently, the first coated layer in which the pattern of the mask is transferred is heated to cure (step S4). When the photosensitive resin material (A) is the positive photosensitive resin material (A-1), the compound (F) which produces an acid by heating is decomposed to produce an acid, the organic group $R^3$ which is capable of being detached by an acid in the positive photosensitive resin material (A-1) is detached, and an alkali soluble group is produced. The alkali soluble group has an active hydrogen. In addition, the first functional group in the positive photosensitive resin material (A-1) is deprotected by heating, and the second functional group which reacts with an active hydrogen is produced from the first functional group. The second functional group and the alkali soluble group react to form a cross-linked structure, and whereby, the first insulating layer is formed.

The heating temperature in the step S4 is usually 100 to 280° C., preferably 150 to 250° C., and particularly 180 to 230° C. is preferred. The heating time is usually 5 to 120 minutes, preferably 10 to 60 minutes. If the heating temperature is too low or the heating time is too short, the crosslinking in the insulating layer may be insufficient. If the heating temperature is too high or the heating time is too long, the crosslinking in the insulating layer may be damaged. The heating can be carried out by using a heater, oven and the like.

Then, the patterned electrode is formed on the first insulating layer (step S5). The electrode may be formed by depositing an electrode material with the metal mask vapor-deposition process. Otherwise, an electrode material is deposited with the spattering process, a resist material is applied onto the deposited electrode material, exposed, developed to form a pattern, and the electrode material may be etched by using the resist pattern as a mask.

Next, a solution containing a second insulating layer material and a solvent (second insulating layer coating solution) is applied onto the patterned electrode and the first insulating layer to form the second coated layer (step S6). The second coated layer is optionally dried.

After that, the first insulating layer and the second coated layer is heated (step S7). By heating, the organic group R capable of being detached by an acid in the second coated layer is detached by the action of the tungsten (V) alkoxide, and a hydroxyl group is produced. The hydroxyl group reacts with the cyclic ether structure in the second coated layer, and a cross-linked structure is formed.

The heating temperature in the step S7 is usually 80 to 150° C., preferably 100 to 130° C. The heating time is usually 5 to 120 minutes, preferably 10 to 60 minutes, and particularly 20 to 40 minutes is preferred. If the heating temperature is too low or the heating time is too short, the crosslinking in the insulating layer may be insufficient. If the heating temperature is too high or the heating time is too long, the second coated layer other than that on the first insulating layer may be cured. The heating can be carried out by using a heater, oven and the like.

Subsequently, a part of the second coated layer formed on the patterned electrode and a part of the second coated layer formed on the site in which the first coated layer is removed are removed, and the pattern of the first insulating layer is transferred to the second coated layer, and whereby the second insulating layer is formed (step S8).

The partial removing of the second coated layer (i.e., development) may be carried out by letting the uncured part of the second coated layer which has been partially cured contact with a solvent which dissolves the second insulating layer material and dries at room temperature or under heating. Examples of the suitable solvent to develop the second coated layer are propylene glycol monomethyl ether acetate and 2-heptanone. It is not necessary that an alkali solution is used for developing the second coated layer.

The second insulating layer may be further heated to improve a curing degree.

Another embodiment of a process for forming an organic thin film transistor insulating layer of the present invention comprises the steps of:

applying a solution containing a first insulating layer material and a solvent to a substrate to form a first coated layer on the substrate (step T1);

irradiating a part of the first coated layer with electromagnetic waves or an electron beam (step T2);

removing the part of the first coated layer which is not irradiated with electromagnetic waves or an electron beam to form a pattern in the first coated layer (step T3);

applying heat to the first coated layer in which the pattern is formed to form a first insulating layer (step T4);

forming a patterned electrode on the first insulating layer (step T5);

applying a solution containing a second insulating layer material and a solvent to the patterned electrode and the first insulating layer to form a second coated layer (step T6);

applying heat to the first insulating layer and the second coated layer (step T7); and removing the part of the second coated layer formed on the patterned electrode to form a second insulating layer (step T8).

In the formation of the first insulating layer, for example, the first insulating layer coating solution is prepared, the first insulating layer coating solution is applied to the substrate to form the first coated layer, and the first coated layer is dried. A part of the first coated layer is irradiated with electromagnetic waves or an electron beam through a mask, the first coated layer is treated with heat, and then, the unirradiated part is removed with a solvent which may dissolve the first insulating layer material to develop, and the irradiated part is heated and cured.

In the step T1, the first insulating layer coating solution may be applied onto the substrate by a publicly known method, such as spin coating, die coating, screen printing, and inkjet. The drying of the first coated layer is optionally conducted. The drying as used herein means removing a solvent contained in the first coated layer.

Then, a part of the first coated layer is selectively irradiated with electromagnetic waves or an electron beam, for example, thorough a mask (step T2). The mask used herein has a part which transmits electromagnetic waves or an electron beam having a shape corresponding to the part on which an insulating layer is formed within the surface of the substrate.

When the photosensitive resin material (A) is the negative photosensitive resin material (A-2), the compound (H) which produces an acid by irradiating electromagnetic waves or an electron beam is decomposed to produce an acid, and the ring-opening polymerization of the cyclic ether structure in the negative photosensitive resin material (A-2) occurs. The ring-opening polymerization reaction may be promoted by heating. In addition, the organic group $R^{15}$ which is capable of being detached by an acid in the negative photosensitive resin material (A-2) is detached to produce a phenolic hydroxyl group. The phenolic hydroxyl group reacts with the end of a polymer produced by the ring-opening polymerization of the cyclic ether structure. The first coated layer selectively irradiated with electromagnetic waves or an electron beam through a mask is immersed in a solvent which may dissolve the first insulating layer material, the unirradiated part with electromagnetic waves or an electron beam is dissolved and removed, and the pattern of the mask is transferred to the first coated layer (step T3).

The wavelength of the electromagnetic wave for irradiation is preferably 450 nm or less, more preferably from 150 to 410 nm. If the wavelength of the electromagnetic wave for irradiation is more than 450 nm, the decomposition of the compound (H) which produces an acid becomes insufficient, and the solubility to an alkali solution becomes insufficient. As a result, the pattern may not be formed. As the electromagnetic waves, ultraviolet light is preferred.

The irradiation with ultraviolet light may be carried out by using, for example, an exposure apparatus which is used for producing semiconductors or a LTV lamp which is used for curing LTV-curable resins. For example, ultraviolet light with a wavelength of 300 to 400 nm is used. The irradiation with an electron beam can be carried out by using, for example, an ultrasmall electron beam irradiation tube.

When the first coated layer is heated after the selective irradiation with electromagnetic waves or an electron beam through a mask, the temperature at which the first coated layer is heated is usually 60 to 150° C., preferably 80 to 130° C. The heating time is usually 15 seconds to 10 minutes, preferably 20 seconds to 5 minutes, and particularly 30 seconds to 1 minute is preferred. If the heating temperature is too low or the heating time is too short, the development may become insufficient. If the heating temperature is too high or the heating time is too long, the resolution may be deteriorated. The heating can be carried out by using a heater, oven and the like.

Then, the first coated layer is heated to form the first insulating layer (step T4). When the photosensitive resin material (A) is the negative photosensitive resin material (A-2), the polymer compound (G) in the negative photosensitive resin material has the first functional group, and the first functional group is a functional group which produces a second functional group capable of reacting with an active hydrogen by the action of heat, the second functional group capable of reacting with an active hydrogen is produced by heating the first coated layer in which the mask pattern has been transferred, and the second functional group reacts with a hydroxyl group produced by the ring-opening polymerization reaction of a cyclic ether structure, and reacts with a phenolic hydroxyl group produced by an action of an acid, to form a crosslink structure, and whereby, the first insulating layer is formed.

The heating temperature in the step T4 is usually 100 to 280° C., preferably 150 to 250° C., and particularly 180 to 230° C. is preferred. The heating time is usually 5 to 120 minutes, preferably 10 to 60 minutes. If the heating temperature is too low or the heating time is too short, the crosslinking in the insulating layer may be insufficient. If the heating temperature is too high or the heating time is too long, the crosslinking in the insulating layer may be damaged. The heating can be carried out by using a heater, oven and the like.

Then, the patterned electrode is formed on the first insulating layer (step T5). The electrode may be formed by depositing an electrode material with the metal mask vapor-deposition process. Otherwise, an electrode material is deposited with the spattering process, a resist material is applied onto the deposited electrode material, exposed, developed to form a pattern, and the electrode material may be etched by using the resist pattern as a mask.

A solution containing the second insulating layer material is applied onto the first insulating layer on which the electrode was formed and dried to form the second coated layer.

Subsequently, the second insulating layer coating solution is applied onto the patterned electrode and the first insulating layer to form the second coated layer (step T6). The second coated layer is optionally dried.

Then, the first insulating layer and the second coated layer is heated (step T7). By heating, the organic group R capable of being detached by an acid in the second coated layer is detached by the action of the tungsten (V) alkoxide, and a hydroxyl group is produced. The hydroxyl group reacts with the cyclic ether structure in the second coated layer, and a cross-linked structure is formed.

The heating temperature in the step T7 is usually 80 to 150° C., preferably 100 to 130° C. The heating time is usually 5 to 120 minutes, preferably 10 to 60 minutes, and particularly 20 to 40 minutes is preferred. If the heating temperature is too low or the heating time is too short, the crosslinking in the insulating layer may be insufficient. If the heating temperature is too high or the heating time is too long, the second coated layer other than that on the first insulating layer may be cured. The heating can be carried out by using a heater, oven and the like.

The development process of the second coated layer and the suitable solvent for the development are the same as described above.

Next, a part of the second coated layer formed on the patterned electrode and a part of the second coated layer formed on the site in which the first coated layer is removed are removed, and the pattern of the first insulating layer is transferred to the second coated layer, and whereby the second insulating layer is formed (step T8).

The second insulating layer may be further heated to improve a curing degree.

On the second insulating layer, a self-assembled monomolecular film layer may be formed. The self-assembled monomolecular film layer can be formed by, for example, treating the gate insulating layer with a solution in which from 1 to 10% by weight of an alkylchlorosilane compound or an alkylalkoxysilane compound has been dissolved in an organic solvent.

Examples of the alkylchlorosilane compound include methyltrichlorosilane, ethyltrichlorosilane, butyltrichlorosilane, decyltrichlorosilane and octadecyltrichlorosilane.

Examples of the alkylalkoxysilane compound include methyltrimethoxysilane, ethyltrimethoxysilane, butyltrimethoxysilane, decyltrimethoxysilane and octadecyltrimethoxysilane.

The substrate 1, the gate electrode 2, the source electrode 5, the drain electrode 6 and the organic semiconductor layer 4 may be constituted using materials and methods which are conventionally used. A plate or a film of resin or plastics, a glass plate, a silicon plate or the like is used for the material of the substrate. The electrodes are formed by a publicly known method, such as a vacuum deposition method, a sputtering method, a printing method or an inkjet method, using chromium, gold, silver, aluminum, molybdenum or the like as their materials.

A Π-conjugated polymers is used as an organic semiconductor for forming the organic semiconductor layer 4, and for example, polypyrroles, polythiophenes, polyanilines, polyallylamines, fluorenes, polycarbazoles, polyindoles, and poly(p-phenylenevinylene)s can be used. Moreover, low-molecular substances soluble in organic solvents, e.g., derivatives of polycyclic aromatics such as pentacene, phthalocyanine derivatives, perylene derivatives, tetrathiafulvalene derivatives, tetracyanoquinodimethane derivatives, fullerenes, carbon nanotubes and the like, can be used. Specific examples thereof include a condensate of 2,1,3-benzothiadiazole-4,7-di(ethylene boronate) with 2,6-dibromo-(4,4-bis-hexadecanyl-4H-cyclopenta[2,1-b:3,4-b']-dithiophene, and a condensate of 9,9-di-n-octylfluorene-2,7-di(ethyleneboronate) with 5,5'-dibromo-2,2'-bithiophene.

For example, the formation of the organic semiconductor layer is carried out as follows: an organic semiconductor coating solution is prepared by adding a solvent to an organic semiconductor; the organic semiconductor coating solution is applied onto the second insulating layer; and the organic semiconductor coating solution is dried. In the present invention, a resin which composes the second insulating layer has a benzene ring and has affinity for an organic semiconductor. Therefore, a uniform flat interface is formed between an organic semiconductor layer and a gate insulating layer by the above-mentioned application and drying process.

The solvent to be used in the organic semiconductor coating solution is not particularly limited as long as it can dissolve or disperse organic semiconductors, and it is preferably a solvent having a boiling point of from 50° C. to 200° C. under ambient pressure.

Examples of the solvent include chloroform, toluene, anisole, 2-heptanone, propylene glycol monomethyl ether acetate. As the above-mentioned insulating layer application solution, the organic semiconductor application solution is able to be applied onto the gate insulating layer by a publicly known method, such as spin coating, die coating, screen printing, or inkjet.

The organic thin film transistor of the present invention may be coated with an overcoat material for the purpose of protecting the organic thin film transistor and improving the smoothness of its surface.

In the electronic device insulating layer of the present invention, a smooth film or the like may be layered, and a layered structure may be easily formed. Moreover, an organic electroluminescence device may be suitably mounted on the insulating layer.

The electronic device insulating layer of the present invention may be preferably used to produce a member for displays having an organic thin film transistor. The member for displays having an organic thin film transistor may be used to produce a display having a member for displays.

The electronic device insulating layer of the present invention can also be used for applications for forming a layer contained in a transistor other than an insulating layer such as a bank material, and a layer contained in an organic electroluminescence device.

EXAMPLES

Hereinafter, the present invention will be described by way of examples, but needless to say, the present invention is not intended to be limited to these examples.

Synthesis Example 1

(Synthesis of Polymer Compound 1)

A Dimroth in which a three-way cock was attached to the upper part was attached to a 200 ml three neck flask. In the three neck flask, 25.45 g of 4-vinyl benzoic acid (manufactured by Aldrich), 50 g of 3,4-dihydro-2H-pyran, the catalytic amount of concentrated hydrochloric acid and a stirring bar were charged and the air inside the three neck flask was replaced with nitrogen. A three neck flask was soaked into an oil bath at 50° C., and the reaction was conducted for 2 hours while the stirring bar was rotated by a magnetic stirrer. After the compression of the reaction, the reaction mixture was transferred to a 300 ml separating funnel and 100 ml of diethylether was added thereto. After that, the organic layer was rinsed until a water layer became alkaline by the addition of a sodium hydroxide solution, and the organic layer was separated. After the rinsing of an organic layer was repeated with 50 ml of ion-exchange water at three times, the organic layer was separated, anhydrous magnesium sulfate was added thereto, and the organic layer was dried. After the filtration of anhydrous magnesium sulfate, the filtrate was concentrated by using a rotary evaporator and the compound (1-A) was obtained as a clear and colorless fluid. The amount of the compound (1-A) obtained was 38.25 g, and the yield was 96%.

[Chemical Formula 16]

Compound (1-A)

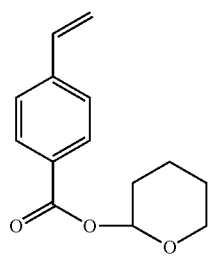

In a 50 ml pressure resistant container (manufactured by Ace), 2.00 g of the compound (1-A), 0.83 g of 4-(1-ethoxyethoxy)styrene (manufactured by TOSOH ORGANIC CHEMICAL Co, Ltd.), 1.03 g of 2-(O-[1'-methylpropylideneamino]carboxyamino)ethyl-methacrylate (manufactured by SHOWA DENKO K.K., the trade name "Karenz MOI-BM"), 0.58 g of 4-methoxystyrene (manufactured by Tokyo Chemical Industry Co., Ltd.), 0.02 g of 2,2'-azobis (2-methylpropionitrile) and 10.41 g of propylene glycol monomethyl ether acetate (manufactured by Tokyo Chemical Industry Co., Ltd.) were charged, subjected to the bubbling with argon gas to remove the dissolved oxygen, and sealed. The polymerization was carried out in an oil bath at 80° C. for 8 hours to obtain a viscous propylene glycol monomethyl ether acetate solution in which the polymer compound 1 was dissolved. The polymer compound 1 has the following repeating unit. The suffix to a parenthesis indicates mole fraction of the repeating unit.

[Chemical Formula 17]

Polymer Compound 1

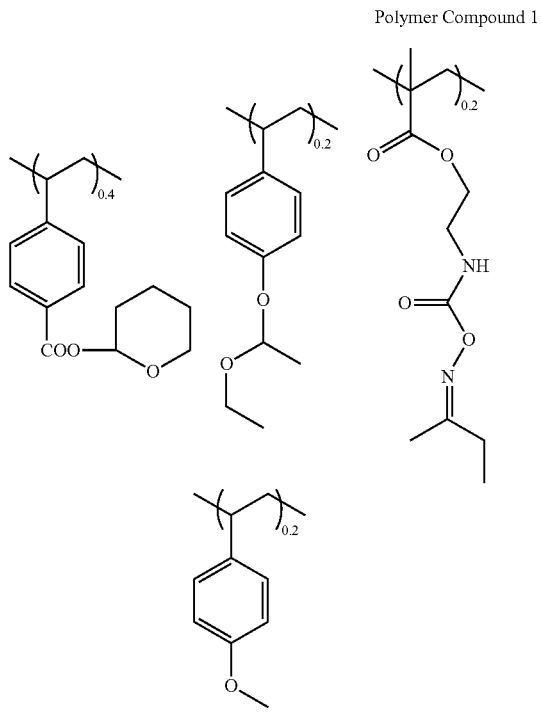

The weight average molecular weight of the resulting polymer compound 1 calculated from reference polystyrene was 78000 (GPC manufactured by SHIMADZU CORPORATION, one Tskgel super HM-H and one Tskgel super H2000, mobile phase=THF).

Synthesis Example 2

(Synthesis of Polymer Compound 2)

In a 50 ml pressure resistant container (manufactured by Ace), 3.00 g of 4-(1-ethoxyethoxy)styrene (manufactured by TOSOH ORGANIC CHEMICAL Co, Ltd.), 0.55 g of acrylonitrile (manufactured by Wako Pure Chemical Industries, Ltd.), 2.02 g of 2,3,4,5,6-pentafluorostyrene (manufactured by Aldrich), 2.22 g of glycidyl methacrylate (manufactured by Wako Pure Chemical Industries, Ltd.), 0.04 g of 2,2'-azobis(2-methylpropionitrile) and 18.28 g of propylene glycol monomethyl ether acetate (manufactured by Tokyo Chemical Industry Co., Ltd.) were charged and subjected to the bubbling with an argon gas to remove the dissolved oxygen and sealed. The polymerization was carried out in an oil bath at 80° C. for 8 hours to obtain a viscous propylene glycol monomethyl ether acetate solution in which the polymer compound 2 was dissolved. The polymer compound 2 has the following repeating unit. The suffix to a parenthesis indicates mole fraction of the repeating unit.

[Chemical Formula 18]

Polymer Compound 2

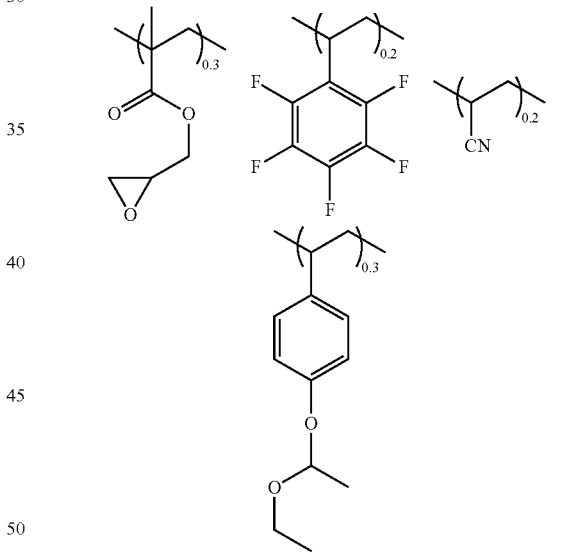

The weight average molecular weight of the resulting polymer compound 2 calculated from reference polystyrene was 190000 (GPC manufactured by SHIMADZU CORPORATION, one Tskgel super HM-H and one Tskgel super H2000, mobile phase=THF).

Synthesis Example 3

(Synthesis of Polymer Compound 3)

In 80 ml of a toluene solution containing 1.88 g of 2,1,3-benzothiadiazole-4,7-di(ethylene boronate) and 3.81 g of 2,6-dibromo-(4,4-bis-hexadecanyl-4H-cyclopenta[2,1-b; 3,4-b']-dithiophene), 0.75 g of tetrakis(triphenylphosphine) palladium, 1.0 g of methyltrioctylammonium chloride (manufactured by Aldrich, the trade name "Aliquat 336"

(registered trademark)) and 24 ml of a 2 M aqueous sodium carbonate solution were added under a nitrogen atmosphere. The resulting mixture was stirred vigorously and heated to reflux for 24 hours. The resulting viscous reaction mixture was poured into 500 ml of acetone to precipitate a fibrous yellow polymer. This polymer was collected by filtration, washed with acetone, and dried at 60° C. in a vacuum oven overnight. The resulting polymer is referred to as a polymer compound 3. The polymer compound 3 has the following repeating unit. n represents the number of repeating units.

[Chemical Formula 19]

Polymer Compound 3

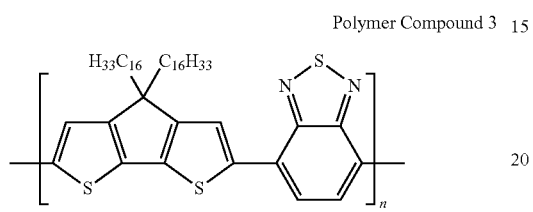

The weight average molecular weight of the polymer compound 3 calculated from reference polystyrene was 32000 (GPC manufactured by SHIMADZU CORPORATION, one Tskgel super HM-H and one Tskgel super H2000, mobile phase=THF).

Synthesis Example 4

(Synthesis of Compound (4-A)

In a 300 ml three neck flask to which a three-way cock and a septum were attached, 33.29 g of 3-ethyl-3-hydroxymethyloxetane (manufactured by TOAGOSEI Co., Ltd., the trade name: OXT-101), 48.31 g of triethylamine (manufactured by Wako Pure Chemical Industries, Ltd.), 200 ml of dehydrated tetrahydrofuran and a stirrer bar were charged, and the air inside the flask was replaced with nitrogen. The flask was soaked into an ice bath, 25.00 g of methacryloyl chloride was slowly dropped by using a gas-tight syringe while the reaction mixture was stirred by rotating the stirrer with a magnetic stirrer. After the completion of dropping, the stirring was further continued in an ice bath for 2 hours, and then the stirring was continued at room temperature overnight and the reaction was conducted. After the compression of the reaction, the triethylamine chloride salt produced was filtrated and separated. The filtrate was transferred to a 500 ml separating funnel and 200 ml of diethylether was added to the filtrate. After that, the organic layer was rinsed with 100 ml of ion-exchange water, and the organic layer was separated. The water washing of an organic layer was repeated by three times, and thereafter, the organic layer was separated, anhydrous magnesium sulfate was added thereto and the organic layer was dried. After the anhydrous magnesium sulfate was filtered, the filtrate was concentrated by using a rotary evaporator and the compound (4-A) was obtained as a light brown fluid. The amount of the compound (4-A) obtained was 29.3 g, and the yield was 61.3%.

[Chemical Formula 20]

Compound (4-A)

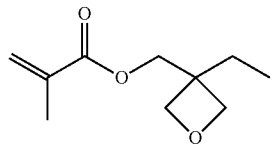

(Synthesis of Polymer Compound 4)

In a 150 ml pressure resistant container (manufactured by Ace), 12.00 g of the compound (4-A), 7.51 g of 4-(1-ethoxyethoxy)styrene (manufactured by TOSOH ORGANIC CHEMICAL Co, Ltd.), 1.85 g of glycidyl methacrylate (manufactured by Wako Pure Chemical Industries, Ltd.), 6.26 g of 2-(O-[1'-methylpropylideneamino]carboxyamino)ethyl-methacrylate (manufactured by SHOWA DENKO K.K., the trade name "Karenz MOI-BM"), 8.74 g of 4-methoxystyrene, 2.77 g of acrylonitrile (manufactured by Wako Pure Chemical Industries, Ltd.), 0.20 g of 2,2'-azobis(2-methylpropionitrile) and 91.75 g of propylene glycol monomethyl ether acetate (manufactured by Tokyo Chemical Industry Co., Ltd.) were charged, subjected to the bubbling with an argon gas and then sealed. The polymerization was carried out in an oil bath at 60° C. for 20 hours to obtain a viscous propylene glycol monomethyl ether acetate solution in which the polymer compound 1 was dissolved. The polymer compound 4 has the following repeating unit. A suffix to a parenthesis indicates mole fraction of a repeating unit.

[Chemical Formula 21]

Polymer Compound 4

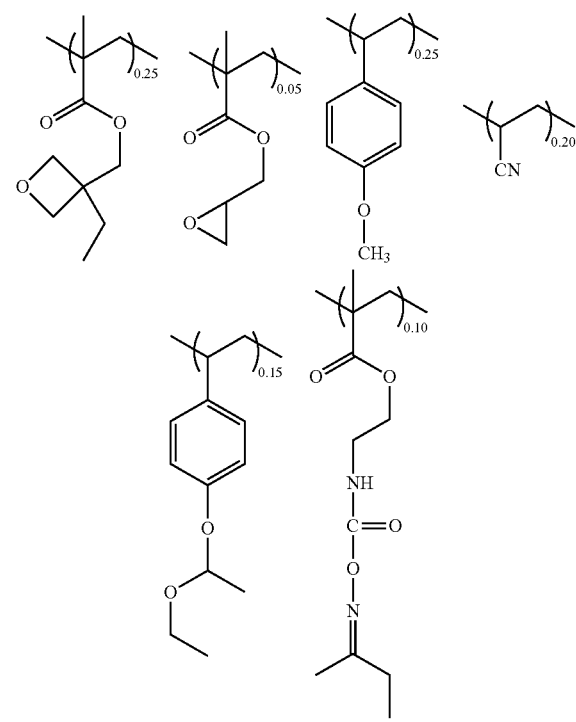

The weight average molecular weight of the resulting polymer compound 4 calculated from reference polystyrene was 99000 (GPC manufactured by SHIMADZU CORPORATION, one Tskgel super HM-H and one Tskgel super H2000, mobile phase=THF).

Example 1

(Production of Electric Field Effect Type Organic Thin Film Transistor)

In a 20 ml sample bottle, 5.00 g of the propylene glycol monomethyl ether acetate solution of the polymer compound 1 obtained in synthetic example 1, 0.045 g of the following compound "MBZ-101 (manufactured by Midori Kagaku Co., Ltd.)" which is a photo-acid generating agent, 5.00 g of propylene glycol monomethyl ether acetate, 0.21 g of tungsten (V) ethoxide (manufactured by Gelest), 0.5 g of acetylacetone (manufactured by Wako Pure Chemical Industries, Ltd.), 0.0014 g of 1,8-diazabicyclo[5,4,0]-undeca-7-en (manufactured by Aldrich) which is a basic compound were charged and dissolved while stirring, and a uniform coating solution 1 which is the first insulating layer material was prepared.

[Chemical Formula 22]

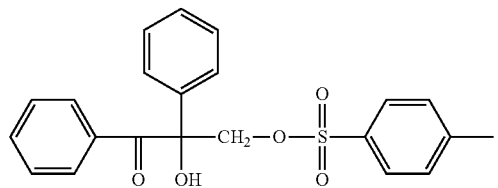

The pyrolysis temperature of MBZ-101 measured using TG-DTA ("DTG-60" from Shimadzu Corporation) was 177° C.

In a 20 ml sample bottle, 1.00 g of the propylene glycol monomethyl ether acetate solution of the polymer compound 2 obtained in synthetic example 2 and 9.00 g of propylene glycol monomethyl ether acetate were charged and dissolved while stirring, and a uniform coating solution 2 which is the second insulating layer material was prepared.

The coating solution 1 was filtered with a membrane filter having a pore diameter of 0.45 µm, applied onto a glass substrate with a chromium electrode by spin coating and dried on a hot plate at 100° C. for 1 minute to form a coated layer. The formation of the coated layer was performed under the air atmosphere. Then, the coated layer was irradiated with UV light (wavelength of 365 nm) of 1200 mJ/cm$^2$ through a mask by using an aligner (manufactured by Canon Inc.; PLA-521), subjected to the post-baking for 30 seconds at 100° C. on a hot plate, immersed in Nagase positive developer NPD-18 for 30 seconds to remove the irradiated part and then developed. The glass substrate after development was rinsed with ion exchange water, dried with a spin drier and then baked in nitrogen on a hot plate at 220° C. for 30 minutes to obtain a first gate insulating layer having a via hole.

A via hole was thus formed in an insulating layer by using the first insulating layer material. As a result, it is possible to omit the steps of: applying a solution containing a resist material on the insulating layer to form a resist layer; exposing the resist layer through a mask; developing the resist layer to form a pattern of the resist layer; transferring the pattern to the insulating layer by using the resist layer as a mask in which the pattern was formed; and carrying out exfoliation removal of the resist layer in which the pattern was formed. Thus, a via hole may be simply formed.

Molybdenum was deposited on the first gate insulating layer having a via hole at a thickness of about 100 nm by the sputtering method, and then all of molybdenum on the first gate insulating layer was removed by using a molybdenum etching solution (manufactured by Kanto Chemical Co., Inc.; S-80520).

The coating solution 2 was filtered with a membrane filter having a pore diameter of 0.45 µm, applied by spin coating onto the first gate insulating layer in which molybdenum was removed, dried on a hot plate at 100° C. for 1 minute, and then baked on a hot plate at 120° C. for 30 minutes to form the second gate insulating layer. Thereby, a substrate with the second gate insulating layer layered on the first gate insulating layer was obtained. With the tungsten (V) ethoxide in the first gate insulating layer, acid was generated from the second insulating layer material which was spin coated to a different part from the beer hall of the first gate insulating layer, the second insulating layer material was cured to form a second gate insulating layer.

The resulting substrate was immersed in propylene glycol monomethyl ether acetate for 1 minute, a part of the second gate insulating layer provided on the via hole of the first gate insulating layer was dissolved and removed. Then, the substrate was baked at 200° C. on a hot plate for 30 minutes.

Then, the polymer compound 3 obtained in synthetic example 3 was dissolved in xylene as a solvent to prepare a solution (organic semiconductor composition) having a concentration of 0.5% by weight, and the solution was filtered through a membrane filter to prepare an application solution 3.

The resulting application solution 3 was applied onto the second gate insulating layer by a spin coating method to form an active layer having a thickness of about 30 nm, and subsequently a source electrode and a drain electrode, each having a channel length of 20 µm and a channel width of 2 mm, were formed on the active layer by a vacuum deposition method using a metal mask, and thereby an electric field effect type organic thin film transistor was produced. Each of the source electrode and the drain electrode has a layered structure in the order of molybdenum oxide and gold from the active layer side.

<Evaluation of Transistor Characteristics>

With respect to the thus-produced electric field effect type organic thin film transistors, the transistor characteristics thereof were measured by using a vacuum prober (BCT22MDC-5-HT-SCU; manufactured by Nagase Electronic Equipments Service Co., Ltd.) under conditions such that a gate voltage Vg was varied from 20 to −40 V and a source-drain voltage Vsd was varied from 0 to −40 V. As the leakage current, the current flowing between a gate and a drain at a gate voltage of −40 V was measured. The result is shown in Table 1.

<Evaluation of the Resist Characteristic of Insulating Layer Materials>

The resist characteristics of the first insulating layer material and the second insulating layer material were evaluated on whether or not a pattern of 25 µm square was resolved. The case where the pattern was resolved was denoted by "O" and the case where the pattern was not resolved was denoted by "X".

Example 2

(Production of Electric Field Effect Type Organic Thin Film Transistor)

In a 20 ml sample bottle, 6.00 g of the propylene glycol monomethyl ether acetate solution of the polymer compound 4 obtained in synthetic example 4, 0.036 g of "MBZ-101 (manufactured by Midori Kagaku Co., Ltd.)" which is a photo-acid generating agent, 4.00 g of propylene glycol monomethyl ether acetate, 0.12 g of tungsten (V) ethoxide (manufactured by Gelest), 0.1 g of acetylacetone (manufactured by Wako Pure Chemical Industries, Ltd.), 0.0011 g of 1,8-diazabicyclo[5, 4, 0]-undeca-7-en (manufactured by Aldrich) which is a basic compound were charged and dissolved while stirring to prepare a uniform coating solution 4 which is the first insulating layer material.

The resulting coating solution 4 was filtered with a membrane filter having a pore diameter of 0.45 µm, applied onto a glass substrate with a chromium electrode by spin coating and dried on a hot plate at 100° C. for 1 minute to prepare a coated layer. The formation of the coated layer was performed under the air atmosphere. Then, the coated layer was irradiated with UV light (wavelength of 365 nm) of 600 mJ/cm$^2$ through a mask by using an aligner (manufactured by Canon Inc.; PLA-521), subjected to the post-baking for 30 seconds at 100° C. on a hot plate, immersed in a mixed solution obtained by mixing 2-heptanone and isopropyl alcohol in a weight of 1:1 for 30 seconds to remove the irradiated part and then developed. The glass substrate after the development was dried with the air-blowing and then baked in nitrogen on a hot plate at 220° C. for 30 minutes to obtain a first gate insulating layer having a via hole.

Molybdenum was deposited on the first gate insulating layer with a via hole at a thickness of about 100 nm by the sputtering method, and all of molybdenum on the first gate insulating layer was removed by using a molybdenum etching solution (manufactured by Kanto Chemical Co., Inc.; S-80520). The coating solution 2 was filtered with a membrane filter having a pore diameter of 0.45 µm, applied by spin coating onto the first gate insulating layer 1 in which molybdenum was removed, dried on a hot plate at 100° C. for 1 minute and then baked on a hot plate at 120° C. for 30 minutes to form a second gate insulating layer. Thereby, a substrate with the second gate insulating layer layered on the first gate insulating layer was obtained.

The resulting substrate was immersed in propylene glycol monomethyl ether acetate for 1 minute, a part of the second gate insulating layer provided on a via hole of the first gate insulating layer was dissolved and removed. Then, the substrate was baked at 200° C. on a hot plate for 30 minutes.

The application solution 3 was applied onto the second gate insulating layer by a spin coating method to form an active layer having a thickness of about 30 nm, and subsequently a source electrode and a drain electrode, each having a channel length of 20 µm and a channel width of 2 mm, were formed on the active layer by a vacuum deposition method using a metal mask, and thereby an electric field effect type organic thin film transistor was produced. Each of the source electrode and the drain electrode has a layered structure in the order of molybdenum oxide and gold from the active layer side.

With respect to the thus-produced electric field effect type organic thin film transistors, the transistor characteristics thereof were measured in the same way as in Example 1. Also, with respect to the first insulating layer material, the resist characteristics were evaluated by the same way as in Example 1 about the first insulating layer material. The result is shown in Table 1.

Example 3

(Production of Electric Field Effect Type Organic Thin Film Transistor)

In a 20 ml sample bottle, 5.00 g of Sumiresist PFI-89B9 (manufactured by Sumitomo Chemical Co., Ltd.) which is a photosensitive resin, 5.00 g of propylene glycol monomethyl ether acetate, 0.12 g of tungsten (V) ethoxide (manufactured by Gelest), 0.4 g of acetylacetone (manufactured by Wako Pure Chemical Industries, Ltd.) were charged and dissolved while stirring, and a uniform coating solution 5 which is a first insulating layer material was prepared.

An electric field effect type organic thin film transistor was produced in the same way as in Example 1 except that the coating solution 5 was used instead of the coating solution 1 and that the first coated layer was irradiated with UV light (wavelength of 365 nm) of 100 mJ/cm$^2$ through a mask. With respect to the thus-produced electric field effect type organic thin film transistors, the transistor characteristics thereof were evaluated in the same way as in Example 1. Also, with respect to the first insulating layer material, the resist characteristics were evaluated by the same way as in Example 1 about the first insulating layer material. The result is shown in Table 1.

Comparative Example 1

(Production of Electric Field Effect Type Organic Thin Film Transistor)

An electric field effect type organic thin film transistor was produced in the same way as in Example 1 except that the second gate insulating layer was not formed, and the transistor characteristics and the resist characteristics of the first insulating layer material were evaluated. The result is shown in Table 1.

Comparative Example 2

(Production of Electric Field Effect Type Organic Thin Film Transistor)

An electric field effect type organic thin film transistor was produced in the same way as in Comparative Example 1 except that the steps of: layering molybdenum on the first gate insulating layer by the sputtering method; and removing molybdenum by using a molybdenum etching solution were not carried out. The result is shown in Table 1.

Comparative Example 3

(Production of Electric Field Effect Type Organic Thin Film Transistor)

An electric field effect type organic thin film transistor was produced in the same way as in Example 2 except that the second gate insulating layer was not formed, and the transistor characteristics and the resist characteristics were evaluated. The result is shown in Table 1.

Comparative Example 4

(Production of Electric Field Effect Type Organic Thin Film Transistor)

An electric field effect type organic thin film transistor was produced in the same way as in Comparative Example 3 except that the steps of: layering molybdenum on the first gate insulating layer by the sputtering method; and removing molybdenum by using a molybdenum etching solution were not carried out. The result is shown in Table 1.

Comparative Example 5

(Production of Electric Field Effect Type Organic Thin Film Transistor)

An electric field effect type organic thin film transistor was produced in the same way as in Example 3 except that the second gate insulating layer was not formed, and the transistor characteristics and the resist characteristics were evaluated. The result is shown in Table 1.

Comparative Example 6

(Production of Electric Field Effect Type Organic Thin Film Transistor)

An electric field effect type organic thin film transistor was produced in the same way as in Comparative Example 3 except that the steps of: layering molybdenum on the first gate insulating layer by the sputtering method; and removing molybdenum by using a molybdenum etching solution were not carried out. The result is shown in Table 1.

TABLE 1

|  | Resist Characteristics | Vth1 | Hysteresis |
| --- | --- | --- | --- |
| Example 1 | ◯ | 1.6 V | 0.2 V |
| Example 2 | ◯ | −2.7 V | 0.3 V |
| Example 3 | ◯ | −0.7 V | 0.0 V |
| Comparative Example 1 | ◯ | not work | |
| Comparative Example 2 | ◯ | 5.8 V | 1.7 V |
| Comparative Example 3 | ◯ | not work | |
| Comparative Example 4 | ◯ | −2.5 V | 1.3 V |
| Comparative Example 5 | ◯ | 1.9 V | 2.9 V |
| Comparative Example 6 | ◯ | 0.9 V | 0.2 V |

DESCRIPTION OF REFERENCE SIGNS

1 Substrate
2 Gate electrode
3a First gate insulating layer
3b Second gate insulating layer
4 Organic semiconductor layer
5 Source electrode
6 Drain electrodes
7 Overcoat

The invention claimed is:

1. An electronic device insulating layer comprising a first insulating layer formed from a first insulating layer material and a second insulating layer formed on the first insulating layer from a second insulating layer material, the first insulating layer material is a material containing:
a photosensitive resin material (A); and
a tungsten (V) alkoxide (B),
the second insulating layer material is a material containing a polymer compound (D) which contains:
a repeating unit containing a cyclic ether structure; and
a repeating unit represented by the formula (1):

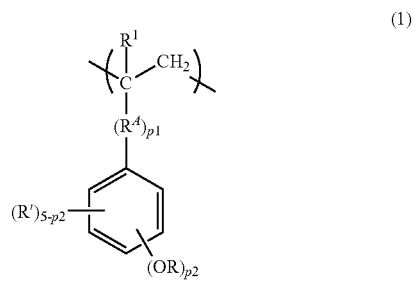

wherein $R^1$ represents a hydrogen atom or a methyl group; $R^A$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms; a hydrogen atom in the monovalent organic group having from 1 to 20 carbon atoms may have been substituted with a fluorine atom; p1 represents an integer of 0 or 1, and p2 represents an integer of 1 to 5; when there are two or more Rs, they may be the same or different; when there are two or more R's, they may be the same or different.

2. The electronic device insulating layer according to claim 1, wherein said first insulating layer material further comprises a basic compound (C).

3. The electronic device insulating layer according to claim 1, wherein said photosensitive resin material (A) is a positive photosensitive resin material (A-1) or a negative photosensitive resin material (A-2).

4. The electronic device insulating layer according to claim 3, wherein said positive photosensitive resin material (A-1) is a photosensitive resin composition comprising:
a polymer compound (E) which contains a repeating unit containing a first functional group defined below and a repeating unit represented by the formula (2):

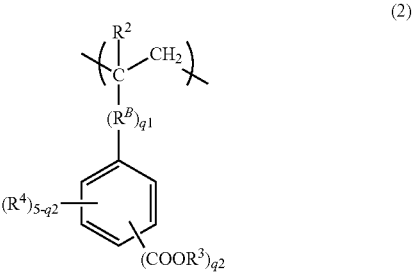

wherein $R^2$ represents a hydrogen atom or a methyl group; $R^B$ represents a linking moiety which links the main chain of the polymer compound with a side chain of the polymer compound and optionally has a fluorine atom; R³ represents an organic group capable of being detached by an acid; R⁴ represents a hydrogen atom or a monovalent organic group having from 1 to 20 carbon atoms; a hydrogen atom in the monovalent organic group having from 1 to 20 carbon atoms may have been substituted with a fluorine atom; q1 represents an integer of 0 or 1, and q2 represents an integer of 1 to 5; when there are two or more R³s, they may be the same or different; when there are two or more R⁴s, they may be the same or different; and a compound (F) having a pyrolysis temperature of 200° C. or lower and capable of affording an acid by irradiating electromagnetic waves or an electron beam:

first functional group: a functional group capable of affording, by the action of electromagnetic waves or heat, a second functional group capable of reacting with active hydrogen.

5. The electronic device insulating layer according to claim 4, wherein said first functional group is at least one group selected from the group consisting of an isocyanato group blocked with a blocking agent and an isothiocyanato group blocked with a blocking agent.

6. The electronic device insulating layer according to claim 5, wherein said isocyanato group blocked with a blocking agent and the isothiocyanato group blocked with a blocking agent are groups selected from the group consisting of groups represented by the formula (3):

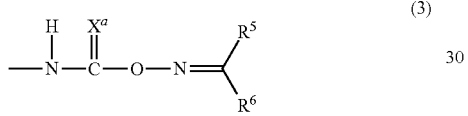

wherein $X^a$ represents an oxygen atom or a sulfur atom; and $R^5$ and $R^6$ each independently represent a hydrogen atom or a monovalent organic group having from 1 to 20 carbon atoms, and groups represented by the formula (4):

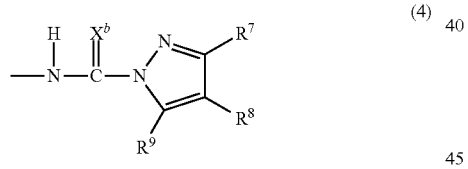

wherein $X^b$ represents an oxygen atom or a sulfur atom; and $R^7$, $R^8$ and $R^9$ each independently represent a hydrogen atom or a monovalent organic group having from 1 to 20 carbon atoms.

7. The electronic device insulating layer according to claim 4, wherein said polymer compound (E) further comprises a repeating unit represented by the formula (5):

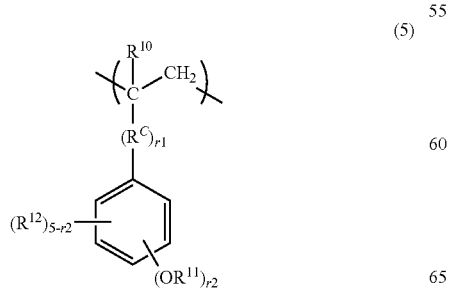

wherein $R^{10}$ represents a hydrogen atom or a methyl group; $R^C$ represents a linking moiety which links the main chain of the polymer compound with a side chain of the polymer compound and optionally has a fluorine atom; $R^{11}$ represents an organic group capable of being detached by an acid; $R^{12}$ represents a hydrogen atom or a monovalent organic group having from 1 to 20 carbon atoms; a hydrogen atom in the monovalent organic group having from 1 to 20 carbon atoms may have been substituted with a fluorine atom; r1 represents an integer of 0 or 1, and r2 represents an integer of 1 to 5; when there are two or more $R^{11}$s, they may be the same or different; when there are two or more $R^{12}$s, they may be the same or different.

8. The electronic device insulating layer according to claim 3, wherein said negative photosensitive resin material (A-2) is a photosensitive resin composition comprising:

a polymer compound (G) which contains a repeating unit containing a cyclic ether structure and a repeating unit represented by the formula (7):

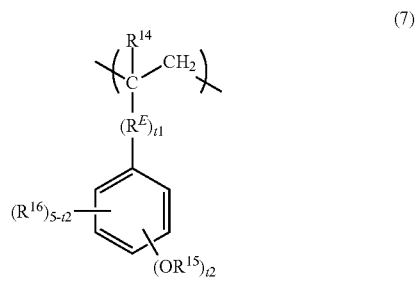

wherein $R^{14}$ represents a hydrogen atom or a methyl group; $R^E$ represents a linking moiety which links the main chain of the polymer compound with a side chain of the polymer compound and optionally has a fluorine atom; $R^{15}$ represents an organic group capable of being detached by an acid; $R^{16}$ represents a hydrogen atom or a monovalent organic group having from 1 to 20 carbon atoms; a hydrogen atom in the monovalent organic group having from 1 to 20 carbon atoms may have been substituted with a fluorine atom; t1 represents an integer of 0 or 1, and t2 represents an integer of 1 to 5; when there are two or more $R^{15}$s, they may be the same or different; when there are two or more $R^{16}$s, they may be the same or different; and a compound (H) which is capable of affording an acid by irradiating electromagnetic waves or an electron beam.

9. The electronic device insulating layer according to claim 8, wherein said repeating unit having a cyclic ether structure contained in the polymer compound (G) is at least one repeating unit selected from the group consisting of:

a repeating unit represented by the formula (8):

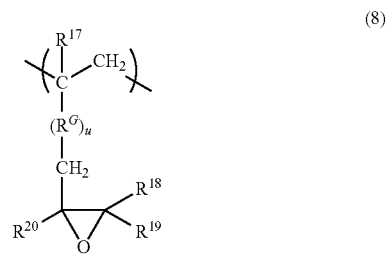

wherein $R^{17}$ represents a hydrogen atom or a methyl group; $R^{18}$, $R^{19}$ and $R^{20}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^G$ represents a linking moiety which links the main chain of the polymer compound with a side chain of the polymer compound and optionally has a fluorine atom; u represents an integer of 0 or 1; and a repeating unit represented by the formula (9):

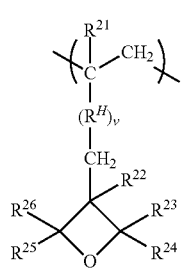

(9)

wherein $R^{21}$ represents a hydrogen atom or a methyl group; $R^{22}$, $R^{23}$, $R^{24}$, $R^{25}$ and $R^{26}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^H$ represents a linking moiety which links the main chain of the polymer compound with a side chain of the polymer compound and optionally has a fluorine atom; v represents an integer of 0 or 1.

10. The electronic device insulating layer according to claim 8, wherein said polymer compound (G) contains at least one repeating unit selected from the group consisting of repeating units containing a first functional group defined below.

first functional group: a functional group capable of affording, by the action of electromagnetic waves or heat, a second functional group capable of reacting with active hydrogen.

11. The electronic device insulating layer according to claim 1, wherein said second insulating layer material is a material consisting of the polymer compound (D).

12. The electronic device insulating layer according to claim 1, wherein said repeating unit having a cyclic ether structure contained in the polymer compound (D) is at least one repeating unit selected from the group consisting of:

a repeating unit represented by the formula (11):

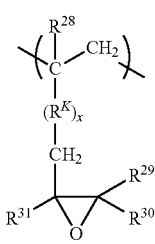

(11)

wherein $R^{28}$ represents a hydrogen atom or a methyl group; $R^{29}$, $R^{30}$ and $R^{31}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^K$ represents a linking moiety which links the main chain of the polymer compound with a side chain of the polymer compound and optionally has a fluorine atom; x represents an integer of 0 or 1; and a repeating unit represented by the formula (12):

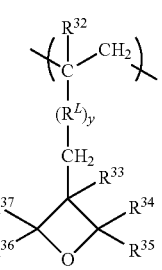

(12)

wherein $R^{32}$ represents a hydrogen atom or a methyl group; $R^{33}$, $R^{34}$, $R^{35}$, $R^{36}$ and $R^{37}$ each independently represent a hydrogen atom or a monovalent organic group having from 1 to 20 carbon atoms; a hydrogen atom in the monovalent organic group having from 1 to 20 carbon atoms may have been substituted with a fluorine atom; $R^L$ represents a linking moiety which links the main chain of the polymer compound with a side chain of the polymer compound and optionally has a fluorine atom; y represents an integer of 0 or 1.

13. The electronic device insulating layer according to claim 1, wherein said polymer compound (D) comprises at least one repeating unit selected from the group consisting of:

a repeating unit represented by the formula (13):

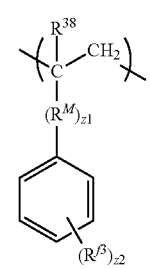

(13)

wherein $R^{38}$ represents a hydrogen atom or a methyl group; $R^{f3}$ represents a fluorine atom or a monovalent organic group having from 1 to 20 carbon atoms and optionally having a fluorine atom; $R^M$ represents a linking moiety which links the main chain of the polymer compound with a side chain of the polymer compound and optionally has a fluorine atom; z1 represents an integer of 0 or 1; z2 represents an integer of from 1 to 5; when there are two or more $R^{f3}$s, they may be the same or different provided that at least one $R^{f3}$ is a fluorine atom or a monovalent organic group having from 1 to 20 carbon atoms and having a fluorine atom; and a repeating unit containing the first functional group.

14. The electronic device insulating layer according to claim 1, wherein the electronic device insulating layer is an organic thin film transistor insulating layer.

15. An organic thin film transistor comprising a gate electrode, a sauce electrode, a drain electrode, an organic semiconductor layer and the electronic device insulating layer according to claim 14.

16. A member for a display, wherein the member comprises the electronic device insulating layer according to claim 1.

17. A display comprising the member for a display according to claim 16.

18. A production process of an electronic device insulating layer comprising the steps of:

applying a solution containing a first insulating layer material and a solvent to a substrate to form a first coated layer on the substrate;

irradiating a part of the first coated layer with electromagnetic waves or an electron beam;

removing a part of the first coated layer irradiated with electromagnetic waves or an electron beam to form a pattern in the first coated layer;

applying heat to the first coated layer on which the pattern is formed to form the first insulating layer;

forming a patterned electrode on the first insulating layer;

applying a solution containing a second insulating layer material and solvent to the patterned electrode and the first insulating layer to form a second coated layer;

applying heat to the first insulating layer and the second coated layer; and removing a part of the second coated layer formed on the patterned electrode to form the second insulating layer, wherein the first insulating layer material is a material comprising:

a photosensitive resin material (A); and a tungsten (V) alkoxide (B), and the second insulating layer material is a material comprising a polymer compound (D) which contains:

a repeating unit containing a cyclic ether structure; and a repeating unit represented by the formula (1):

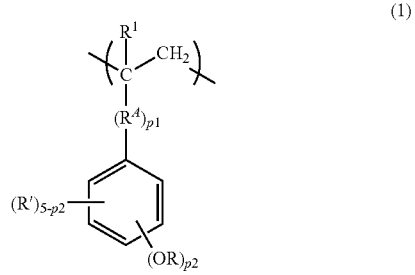

(1)

wherein $R^1$ represents a hydrogen atom or a methyl group; $R^A$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms; a hydrogen atom in the monovalent organic group having from 1 to 20 carbon atoms may have been substituted with a fluorine atom; p1 represents an integer of 0 or 1, and p2 represents an integer of 1 to 5; when there are two or more Rs, they may be the same or different;

when there are two or more R's, they may be the same or different.

19. The production process of an electronic device insulating layer according to claim 18, wherein said electromagnetic waves are ultraviolet light.

20. An electronic device insulating layer produced by the process according to claim 18.

21. The electronic device insulating layer according to claim 20, wherein the electronic device insulating layer is an organic thin film transistor insulating layer.

22. A production process of an electronic device insulating layer comprising the steps of:

applying a solution containing a first insulating layer material and solvent to a substrate to form a first coated layer on the substrate;

irradiating a part of the first coated layer with electromagnetic waves or an electron beam;

removing a part of the first coated layer which is not irradiated with electromagnetic waves or an electron beam to form a pattern on the first coated layer;

applying heat to the first coated layer on which the pattern is formed to form the first insulating layer;

forming the patterned electrode on the first insulating layer;

applying a solution containing a second insulating layer material and solvent to the patterned electrode and the first insulating layer to form a second coated layer;

applying heat to the first insulating layer and the second coated layer; and removing a part of the second coated layer formed on the patterned electrode to form the second insulating layer, wherein the first insulating layer material is a material comprising:

a photosensitive resin material (A); and a tungsten (V) alkoxide (B), and the second insulating layer material is a material comprising a polymer compound (D) which contains:

a repeating unit containing a cyclic ether structure; and a repeating unit represented by the formula (1):

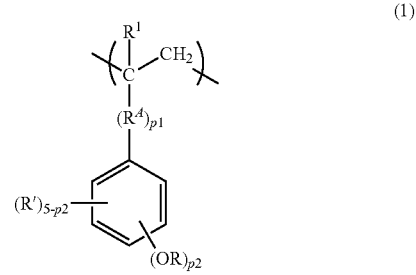

(1)

wherein $R^1$ represents a hydrogen atom or a methyl group; $R^A$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms; a hydrogen atom in the monovalent organic group having from 1 to 20 carbon atoms may have been substituted with a fluorine atom; p1 represents an integer of 0 or 1, and p2 represents an integer of 1 to 5; when there are two or more Rs, they may be the same or different; when there are two or more R's, they may be the same or different.

* * * * *